(12) United States Patent
Hsu et al.

(10) Patent No.: US 12,550,798 B2
(45) Date of Patent: Feb. 10, 2026

(54) INTERPOSER WITH BUILT-IN WIRING FOR TESTING AN EMBEDDED INTEGRATED PASSIVE DEVICE AND METHODS FOR FORMING THE SAME

(71) Applicant: Taiwan Semiconductor Manufacturing Company Limited, Hsinchu (TW)

(72) Inventors: Kuo-Ching Hsu, Taipei (TW); Hsiang-Tai Lu, Zhubei (TW); Kuan-Lung Wu, Hsinchu (TW); Ya Huei Lee, Zhunan Township (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 447 days.

(21) Appl. No.: 18/322,735

(22) Filed: May 24, 2023

(65) Prior Publication Data

US 2024/0266266 A1   Aug. 8, 2024

Related U.S. Application Data

(60) Provisional application No. 63/443,861, filed on Feb. 7, 2023.

(51) Int. Cl.
*H01L 23/498* (2006.01)
*H01L 23/00* (2006.01)
*H01L 25/065* (2023.01)

(52) U.S. Cl.
CPC ........ *H01L 23/49816* (2013.01); *H01L 24/16* (2013.01); *H01L 24/32* (2013.01);
(Continued)

(58) Field of Classification Search
CPC combination set(s) only.
See application file for complete search history.

(56) References Cited

U.S. PATENT DOCUMENTS

| 10,796,990 B2 * | 10/2020 | Chen ................... H01L 23/5223 |
| 2007/0263364 A1 * | 11/2007 | Kawabe ............... H05K 1/0231 |
| | | 257/E23.079 |

(Continued)

FOREIGN PATENT DOCUMENTS

| TW | 201834086 A | 9/2018 |
| TW | 202008546 A | 2/2020 |
| TW | 202238884 A | 10/2022 |

OTHER PUBLICATIONS

TW Patent and Trademark Office; TW ApplicationNo. 112127333; office action mailed Oct. 4, 2024; 8 pages.

(Continued)

*Primary Examiner* — Errol V Fernandes
(74) *Attorney, Agent, or Firm* — The Marbury Law Group, PLLC

(57) ABSTRACT

A semiconductor structure includes: an interposer including an integrated passive device, a die-side redistribution structure, first on-interposer bump structures, and second on-interposer bump structures. First die-side redistribution wiring interconnects electrically connect electrical nodes within the integrated passive device to the first on-interposer bump structures. Second die-side redistribution wiring interconnects provide a respective electrical connection between a respective pair of second on-interposer bump structures. A first semiconductor die includes first on-die bump structures that are bonded to the first on-interposer bump structures through first solder material portions, and further includes second on-die bump structures that are bonded to the second on-interposer bump structures through second solder material portions. The first semiconductor die includes first metal interconnect structures providing electrical connections
(Continued)

between a respective one of the first on-interposer bump structures and a respective one of the second on-interposer bump structures.

20 Claims, 11 Drawing Sheets

(52) U.S. Cl.
CPC .......... *H01L 24/73* (2013.01); *H01L 25/0657* (2013.01); *H01L 2224/16225* (2013.01); *H01L 2224/32225* (2013.01); *H01L 2224/73204* (2013.01); *H01L 2225/06517* (2013.01); *H01L 2225/06541* (2013.01)

(56) References Cited

U.S. PATENT DOCUMENTS

| | | | |
|---|---|---|---|
| 2016/0086930 A1* | 3/2016 | Koey | H01L 24/20 |
| | | | 257/773 |
| 2019/0131273 A1* | 5/2019 | Chen | H01L 24/92 |
| 2021/0091005 A1* | 3/2021 | Tsai | H01L 25/105 |
| 2022/0157810 A1 | 5/2022 | Suk et al. | |
| 2022/0302003 A1* | 9/2022 | Pan | H01L 23/5385 |

OTHER PUBLICATIONS

TW Patent and Trademark Office; TW ApplicationNo. 112127333; office action mailed Dec. 4, 2024; 16 pages.

* cited by examiner

INTERPOSER WITH BUILT-IN WIRING FOR TESTING AN EMBEDDED INTEGRATED PASSIVE DEVICE AND METHODS FOR FORMING THE SAME

RELATED APPLICATIONS

This application claims priority from U.S. Provisional Application Ser. No. 63/443,861 entitled "Unique Layout to protect embedded component and prevent damage during substrate open short test," filed on Feb. 7, 2023, the entire contents of which is incorporated herein by reference for all purposes.

BACKGROUND

Interposers may be used to connect a printed circuit board (PCB) with at least one semiconductor die or other electronic components together. Integrated passive devices may include components that may be damaged by application of a high voltage, such as a capacitor structure. At the same time, redistribution wiring interconnects within an interposer may need to be tested at a high voltage to ensure that electrical shorts (i.e., unintended electrical connections) are not present in the interposer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
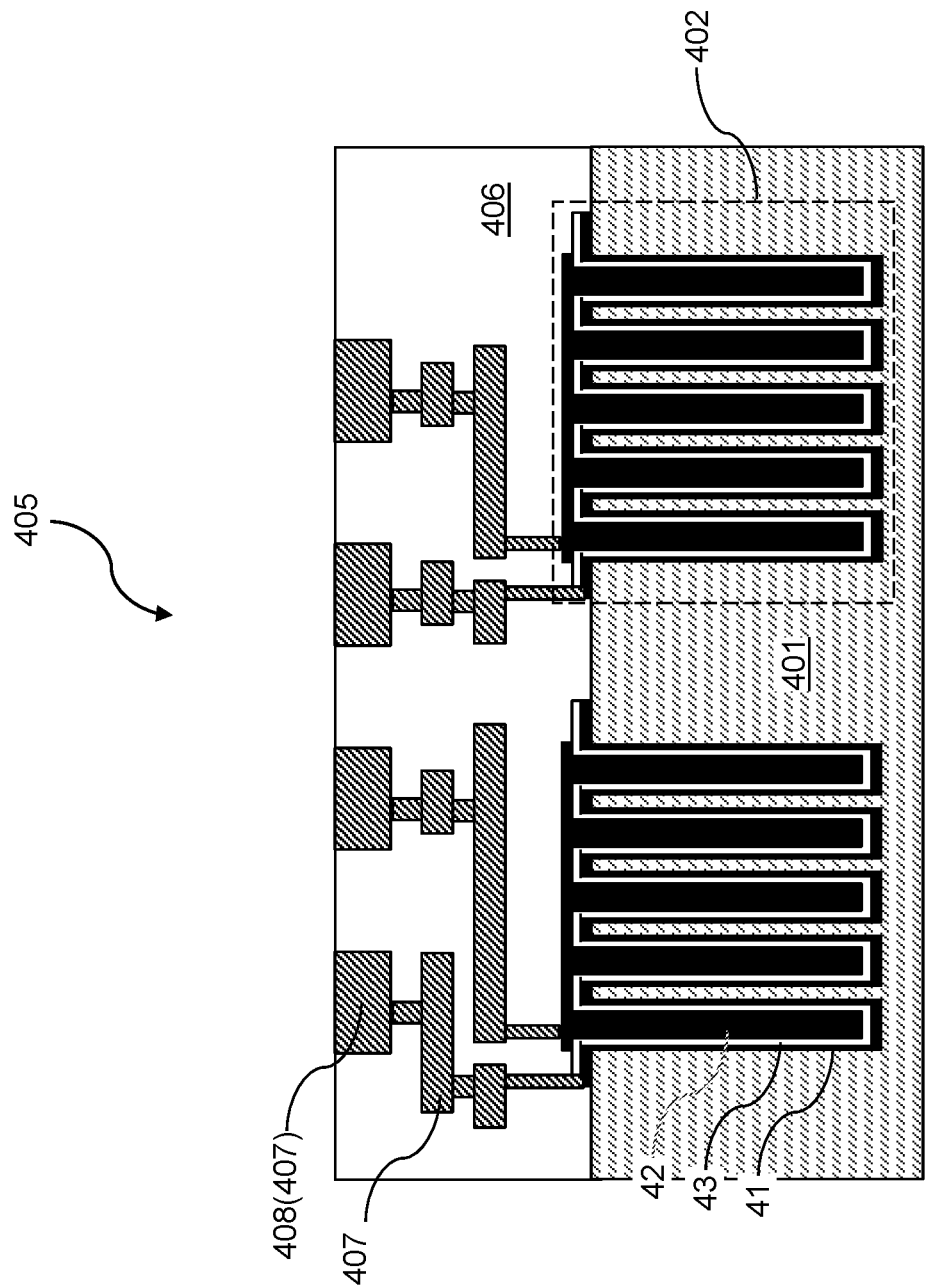
FIG. 1 is a vertical cross-sectional view of an integrated passive device according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Fan-out packages are used to achieve high performance characteristics such as low latency, high power efficiency, and large bandwidth. Some fan-out packages use an interposer with an embedded die, such as a local silicon interconnect (LSI) bridge. Such embedded dies may be prone to die cracks or underfill delamination due to thermal expansion mismatch between the embedded die and a surrounding matrix material. Such embedded dies may also be prone to deformation during a thermal compression bonding process. The thermal compression bonding process involves heating the interposer and the electronic component to be connected to it, and then applying pressure to bond the interposer and the electronic component together. The heat and pressure may cause the interposer and embedded dies therein to deform. The amount of deformation may depend on the specific materials used and the conditions of the thermal compression bonding process Various embodiments disclosed herein may be directed to semiconductor structures, and particularly to a semiconductor structure including an assembly of an interposer containing at least one integrated passive device therein and at least one semiconductor die that is attached to the interposer. The embodiment interposers may include redistribution wiring interconnects that are used to connect electrical nodes of the at least one integrated passive device to various bonding pads of the at least one semiconductor die. In embodiments in which the at least one integrated passive device includes a voltage-sensitive component, such as a capacitor, such a voltage-sensitive component may be permanently damaged by a high voltage bias. Thus, redistribution wiring interconnects that are directly connected to the at least one integrated passive device should not be normally tested at a high test bias voltage.

According to an aspect of the present disclosure, redistribution wiring interconnects used to connect an integrated passive device may be divided into two subsets. A first subset connects electrical nodes of the integrated passive device to first on-interposer bump structures that are proximal to the integrated passive device. A second subset provides electrical connections between pairs of second on-interposer bump structures that are not electrically connected to the integrated passive device unless a semiconductor die is attached to the interposer. The second subset may include a predominant fraction of electrical wiring that electrically connects various electrical nodes of the semiconductor die to the integrated passive device. The semiconductor die includes electrically conductive paths that connect pairs of a first on-interposer bump structure and a second on-interposer bump structure.

The leakage current of the second subset of the redistribution wiring interconnects may be tested at a high test voltage prior to bonding the semiconductor die to the interposer. Thus, the interposer may be properly screened (i.e., tested, analyzed) prior to bonding a semiconductor die thereto without applying an excessive voltage to the integrated passive device itself. Various aspects of embodiments of the present disclosure are now described with reference to accompanying figures.

Referring to FIG. 1, an integrated passive device 405 that may be used to form an interposer of the present disclosure is illustrated. The integrated passive device is a device that is subsequently "integrated" into an interposer and includes at least one "passive" device therein. As used herein, a passive device refers to an electronic component that does not utilize an external power source to activate the operational mechanism thereof, and is used to store, filter, modify, or otherwise regulate electrical signal. Examples of passive devices include resistors, capacitors, and inductors. Field effect transistors are not referred to as passive devices because the operation of field effect transistors utilize an external bias voltage to activate the operational mechanism (i.e., gate/bias voltage). An "integrated" component refers to a component that becomes a component of a larger structure upon electrical connection.

The integrated passive device 405 comprises at least one passive device, which may comprise at least one capacitor 402, at least one inductor (not illustrated), at least one resistor (not illustrated), at least one diode (not illustrated), and/or other additional passive devices. For example, the integrated passive device 405 may comprise a capacitor 402 located within an integrated-device substrate 401 (which may be a semiconductor substrate) and comprising a first electrode layer 41, a node dielectric 43, and a second electrode layer 42. The integrated passive device 405 may further comprise integrated-device metal interconnect structures 407 embedded within integrated-device dielectric material layers 406. A subset of the integrated-device metal interconnect structures 407 may comprise metal pads (which are herein referred to as integrated-device metal pads 408) having physically exposed surfaces and embedded within a topmost layer selected from the integrated-device dielectric material layers 406. The integrated-device metal interconnect structures 407 may be electrically connected to the various nodes of discrete passive devices (such as the at least one capacitor 402) within the integrated passive device 405.

Figure 2:
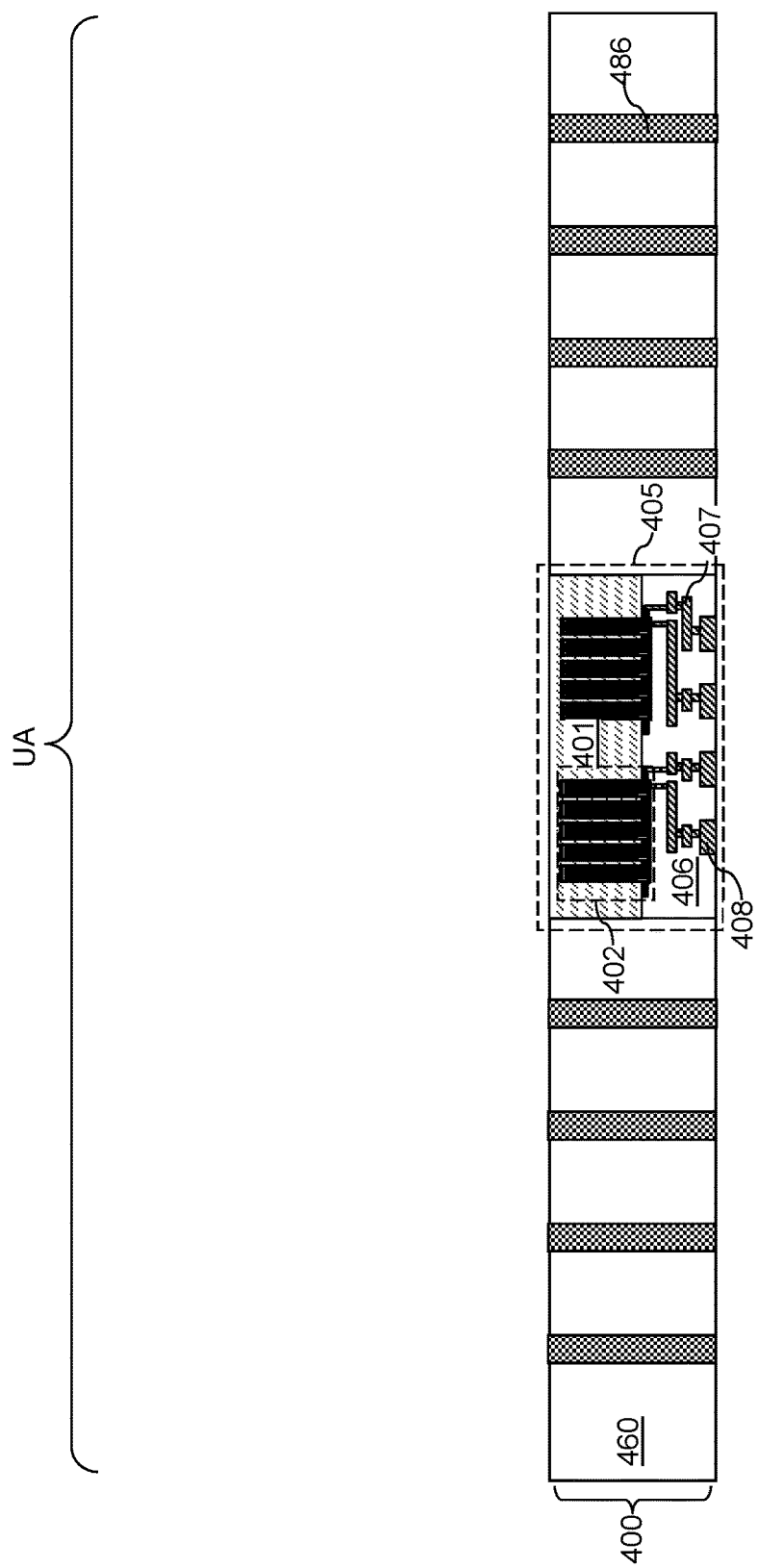
FIG. 2 is a vertical cross-sectional view of an intermediate structure after formation of through-integrated-fan-out-via structures (TIV structures) and a molding compound interposer frame around the integrated passive device according to an embodiment of the present disclosure.

Referring to FIG. 2, an array of conductive via structures may be formed around the integrated passive device 405. The conductive via structures are herein referred to as through-integrated-fan-out-via structures 486, through-InFO-via structures 486, or TIV structures 486. The TIV structures 486 comprise, and/or consist essentially of, at least one metallic material such as W, Mo, Ta, Ti, WN, TaN, TiN, etc. A carrier wafer (not shown) may be optionally used to provide temporary support to the integrated passive device 405 and the through-InFO-via structures 486. The carrier wafer may include an optically transparent substrate such as a glass substrate or a sapphire substrate, or may comprise a semiconductor substrate such as a silicon substrate. Alternatively, the carrier wafer may be provided in a rectangular panel format.

An encapsulant, such as a molding compound (MC) may be applied to the gaps between the integrated passive device 405 and the TIV structures 486. The MC may include an epoxy-containing compound that may be hardened (i.e., cured) to provide a dielectric material portion having sufficient stiffness and mechanical strength. The MC may include epoxy resin, hardener, silica (as a filler material), and other additives. The MC may be provided in a liquid form or in a solid form depending on the viscosity and flowability. Liquid MC typically provides better handling, good flowability, less voids, better fill, and less flow marks. Solid MC typically provides less cure shrinkage, better stand-off, and less die drift. A high filler content (such as 85% in weight) within an MC may decrease the time in mold, lower the mold shrinkage, and reduce the mold warpage. Uniform filler size distribution in the MC may reduce flow marks, and may enhance flowability. The exemplary structure may comprise a reconstituted wafer in which a plurality of integrated passive devices 405 is incorporated within layer of the MC.

The MC may be cured at a curing temperature to form an MC matrix, which is herein referred to as a first MC matrix or an interposer-level MC matrix. In embodiments in which underfill material portions are used to laterally surround the array of microbump bonding structures, such underfill material portions may be incorporated into the first MC matrix. The first MC matrix laterally encloses each of the integrated passive devices and the TIV structures 486. The first MC matrix may be a continuous material layer that extends across the entirety of the area of the reconstituted wafer. As such, the first MC matrix may include a plurality of molding compound (MC) interposer frames 460 that are laterally adjoined to one another. Each MC interposer frame 460 corresponds to a portion of the first MC matrix located within a unit area, i.e., an area of a single interposer to be subsequently formed. Each MC interposer frame 460 may be located within a respective unit area, and laterally surrounds a respective integrated passive device 405 and a respective array of TIV structures 486. Excess portions of the first MC matrix may be removed from above the horizontal plane including the top surfaces of the integrated passive device 405 and the TIV structures 486 by a planarization process, which may use chemical mechanical planarization (CMP). A horizontal surface of the integrated-device substrate 401 may be physically exposed after the planarization process.

The intermediate structure may comprise a reconstituted wafer including a two-dimensional array of passive-device-including structures 400. Each portion of the reconstituted wafer located within a unit area UA constitutes a passivedevice-including structure 400. As used herein, an "in-process" element or intermediate structure may refer to an element that is modified in a subsequent processing step, for example, by patterning, by change of material composition, and/or by addition or subtraction of a material portion. Each passive-device-including structure 400 comprises an integrated passive device 405, a set of TIV structures 486, and an MC interposer frame 460 (which is a portion of the first MC matrix). The carrier wafer may be detached from the reconstituted wafer.

While the present disclosure is described using a region of around a single integrated passive device 405, a two-dimensional array of integrated passive devices 405 may be used, and a two-dimensional array of passive-die-including structures 400 may be formed. In this embodiment, the intermediate structure illustrated in FIG. 2 may be repeated along two different horizontal directions so that a reconstituted wafer includes a two-dimensional array of passive-die-including structures 400. In this embodiment, the area that forms a unit of repetition in a plan view is herein referred to as a unit area UA. FIG. 2 illustrates only a portion of the intermediate structure located in a unit area UA.

Figure 3:
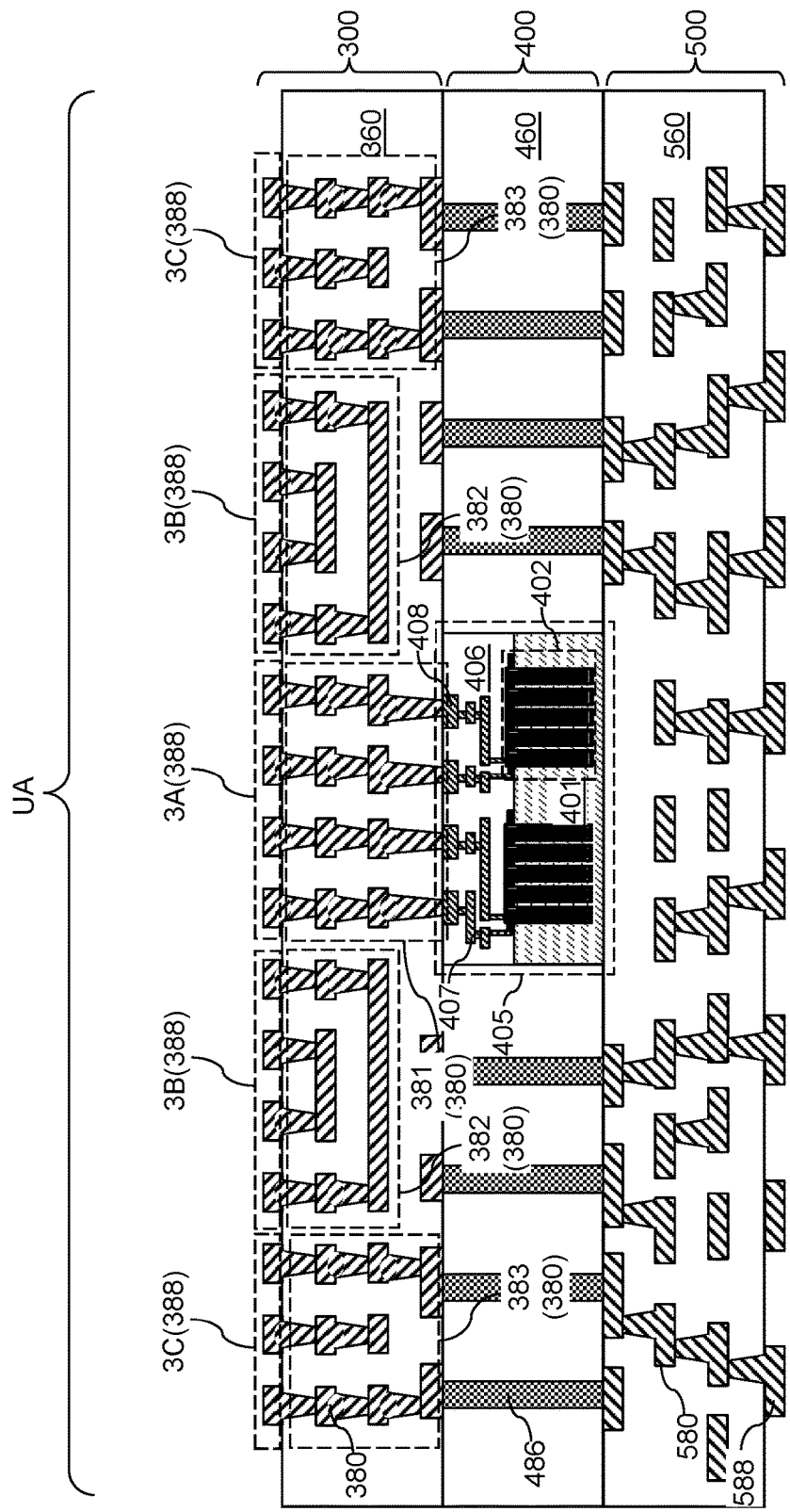
FIG. 3 is vertical cross-sectional view of the intermediate structure after formation of a substrate-side redistribution structure and a die-side redistribution structure according to an embodiment of the present disclosure.

Referring to FIG. 3, a substrate-side redistribution structure 500 and a die-side redistribution structure 300 may be simultaneously formed on the passive-die-including structure 400. The substrate-side redistribution structure 500 comprises substrate-side redistribution dielectric layers 560 and substrate-side redistribution wiring interconnects 580. The substrate-side redistribution dielectric layers 560 are also referred to as first redistribution dielectric layers, and the substrate-side redistribution wiring interconnects 580 are also referred to as first redistribution wiring interconnects. The die-side redistribution structure 300 comprises die-side redistribution dielectric layers 360 and die-side redistribution wiring interconnects 380. The die-side redistribution dielectric layers 360 are also referred to as second redistribution dielectric layers, and the die-side redistribution wiring interconnects 380 are also referred to as second redistribution wiring interconnects.

The substrate-side redistribution dielectric layer 560, the die-side redistribution dielectric layer 360, the substrate-side redistribution wiring interconnects 580, and the die-side redistribution wiring interconnects 380 may be formed by performing a sequence of processing steps at least once. The sequence of processing steps includes a dielectric deposition step that deposits a substrate-side redistribution dielectric layer and a die-side redistribution dielectric layer simultaneously, a patterning step that forms openings through the substrate-side redistribution dielectric layer and the die-side redistribution dielectric layer, a metal deposition step that deposits a metallic material layer (such as a copper layer) over planar surfaces and in openings of the substrate-side redistribution dielectric layer and the die-side redistribution dielectric layer, and a patterning step that patterns the metallic material layer into a respective subset of the substrate-side redistribution wiring interconnects 580 and a respective subset of the die-side redistribution wiring interconnects 380 formed at a respective level.

Interposer-side bonding pads 588 may be formed at the most distal level of the substrate-side redistribution dielectric layers 560. In one embodiment, the interposer bonding pads 588 may be formed as a two-dimensional array of interposer bonding pads 588, which may be a periodic array such as a rectangular array or a hexagonal array. Generally, the pitches of the two-dimensional array of interposer bonding pads 588 along horizontal directions may be in a range from 100 microns to 800 microns, although lesser and greater pitches may also be used. For example, the pitches of the two-dimensional array of interposer bonding pads 588 may be in a range from 200 microns to 700 microns, although lesser and greater pitches may also be used. A substrate-side redistribution structure 500 may be formed within each unit area UA of the reconstituted wafer.

On-interposer bump structures 388 may be formed at the most distal level of the die-side redistribution dielectric layer 360. The on-interposer bump structures 388 are bump structures that are subsequently used to attach semiconductor dies. In one embodiment, the on-interposer bump structures 388 may be formed at the same processing step as the interposer-side bonding pads 588, and thus, may have the same material composition and the same thickness as the interposer-side bonding pads 588. The metallic material of the on-interposer bump structures 388 may include copper. Other metallic materials are within the contemplated scope of disclosure.

The on-interposer bump structures 388 may have horizontal cross-sectional shapes of rectangles, rounded rectangles, or circles. Other horizontal cross-sectional shapes may be within the contemplated scope of disclosure. Typically, the on-interposer bump structures 388 may be configured for microbump bonding, and may have a thickness in a range from 10 microns to 100 microns, although lesser or greater thicknesses may also be used. In such an embodiment, the on-interposer bump structures 388 may be formed as an array of microbumps (such as copper pillars) having a lateral dimension in a range from 10 microns to 50 microns, and having a pitch in a range from 20 microns to 100 microns. Generally, the pitches of the on-interposer bump structures 388 may be smaller than the pitches of the two-dimensional array of interposer-side bonding pads 588 by a factor in a range from 1 to 40, such as from 2 to 20.

The substrate-side redistribution dielectric layers 560 and the die-side redistribution dielectric layers 360 include a respective dielectric polymer material such as polyimide (PI), benzocyclobutene (BCB), or polybenzobisoxazole (PBO). Each substrate-side redistribution dielectric layer 560 and each die-side redistribution dielectric layer 360 may be formed by spin coating and drying of the respective dielectric polymer material. Each of the substrate-side redistribution dielectric layers 560 and the die-side redistribution dielectric layers 360 may have a respective thickness in a range from 2 microns to 40 microns, such as from 4 microns to 20 microns. Each of the substrate-side redistribution dielectric layers 560 and the die-side redistribution dielectric layers 360 may be patterned, for example, by applying and patterning a respective photoresist layer thereabove, and by transferring the pattern in the photoresist layer into the respective substrate-side redistribution dielectric layer 560 or into the respective die-side redistribution dielectric layer 360 using an etch process such as an anisotropic etch process. The photoresist layer may be subsequently removed, for example, by ashing.

Each combination of a passive-device-including structures 400, a substrate-side redistribution structure 500, and a die-side redistribution structure 300 constitutes an interposer (300, 400, 500), which may be a composite interposer including organic redistribution dielectric layers (360, 560) and inorganic dielectric material layers such as the integrated-device dielectric material layers 406.

In one embodiment, the integrated passive device 405 comprises a semiconductor substrate 401 having a planar surface (such as a bottom surface) and, an entirety of an interface between the substrate-side redistribution dielectric layers 560 and the integrated passive device 405 coincides with the planar surface. In one embodiment, a subset of the substrate-side redistribution wiring interconnects 580 may be formed directly on, and thus, may be in in direct contact with, a subset of metallic structures of the passive-device-including structure 400. In one embodiment, a surface of substrate-side redistribution dielectric layers 560 may be in direct contact with the TIV structures 486.

According to an aspect of the present disclosure, the on-interposer bump structures 388 comprises first on-interposer bump structures 3A, second on-interposer bump structures 3B, and third on-interposer bump structures 3C. The die-side redistribution wiring interconnects 380 comprises first die-side redistribution wiring interconnects 381 electrically connecting electrical nodes within the integrated passive device 405 to the first on-interposer bump structures 3A, and second die-side redistribution wiring interconnects 382 each providing a respective electrical connection between a respective pair selected from second on-interposer bump structures 3B and electrically isolated from the first die-side redistribution wiring interconnects 381, and third die-side redistribution wiring interconnects 383 electrically connected to the TIV structures 486 and electrically isolated from the first die-side redistribution wiring interconnects 381 and from the second die-side redistribution wiring interconnects 382.

In one embodiment, the first die-side redistribution wiring interconnects 381 comprises vertical stacks of metal pads and metal via structures in which each of the metal pads is in direct contact with only with a respective overlying metal via structure, a respective underlying metal via structure, and the die-side redistribution dielectric layers 360. In one embodiment, the integrated passive device 405 comprises integrated-device metal interconnect structures 407 embedded within the integrated-device dielectric material layers 406, which may comprise inorganic dielectric material layers such as silicon oxide layers and silicon nitride layers. A subset of the first die-side redistribution wiring interconnects 381 may be in direct contact with a subset of the integrated-device metal interconnect structures 407. In one embodiment, each of the first die-side redistribution wiring interconnects 381 may be electrically connected to a respective subset of the integrated-device metal interconnect structures 407.

In one embodiment, the integrated passive device 405 comprises a capacitor 402 including a first electrode layer 41, a node dielectric 43, and a second electrode layer 42. In this embodiment, the first electrode layer 41 is electrically connected to one of the first die-side redistribution wiring interconnects 381 through a first subset of the integrated-device metal interconnect structures 407, and the second electrode layer 42 is electrically connected to another of the first die-side redistribution wiring interconnects 381 through a second subset of the integrated-device metal interconnect structures 407.

Each of the second die-side redistribution wiring interconnects 382 may provide a respective electrical connection between a respective pair of second on-interposer bump structures 3B within the second on-interposer bump structures 3B. In one embodiment, the second die-side redistribution wiring interconnects 382 do not directly contact any of the first die-side redistribution wiring interconnects 381, and are electrically isolated from the first die-side redistribution wiring interconnects 381 at this processing step.

The third die-side redistribution wiring interconnects 383 are electrically connected to the TIV structures 486. The third on-interposer bump structures 3C are electrically connected to the third die-side redistribution wiring interconnects 383, and may be electrically isolated from the first die-side redistribution wiring interconnects 381 and from the second die-side redistribution wiring interconnects 382. The first die-side redistribution wiring interconnects 381, the second die-side redistribution wiring interconnects 382, and the third die-side redistribution wiring interconnects 383 are collectively referred to as die-side redistribution wiring interconnects 380. The die-side redistribution wiring interconnects 380 are embedded within the die-side redistribution dielectric layers 360, which contact a horizontal surface of the molding compound interposer frame 460 and a horizontal surface of the integrated passive device 405.

According to an aspect of the present disclosure, electrical connections made using the second die-side redistribution wiring interconnects 382 may be tested by mounting the redistribution wafer onto a test apparatus and by applying first test bias voltages across pairs of second on-interposer bump structures 3B. Further, a leakage current between the first electrode layer 41 and the second electrode layer 42 may be tested by applying a second test bias voltage across the first electrode layer 41 and the second electrode layer 42 through a pair of first die-side redistribution wiring interconnects 381 within the first die-side redistribution wiring interconnects 381. According to an embodiment of the present disclosure, the second test bias voltage has a magnitude that is less than magnitudes of the first test bias voltages.

In one embodiment, the magnitude of the first test bias voltage may be selected at a level that is sufficiently high to detect leakage current that may occur in the second die-side redistribution wiring interconnects 382. The magnitude of the first test bias voltage may be selected at a level that does not damage the passive device under testing within the integrated passive device 405. In an illustrative example, a capacitor 402 within the integrated passive device 405 may be tested to measure a leakage current at an operating voltage of the capacitor 402, which may be in a range from 2 V to 12 V. In this embodiment, the second test bias voltage may be in a range from 2V to 12 V. The second test bias voltage may be applied to various nodes within the integrated passive device 405 through the first die-side redistribution wiring interconnects 381. The first bias voltage may be selected at a level that is sufficiently high to detect any abnormally high leakage level within the second die-side redistribution wiring interconnects 382. In this embodiment, the first test bias voltage may be in a range from 4 V to 50 V.

The leakage level of the third die-side redistribution wiring interconnects 383 may be tested in the same manner as the leakage testing on the second die-side redistribution wiring interconnects 382. The first die-side redistribution wiring interconnects 381 are electrically connected to the passive devices within the integrated passive device 405, and thus, testing of the leakage current in the first die-side redistribution wiring interconnects 381 is performed only up to the level of the second test bias voltage. Generally, structures including only a vertical stack of metal pads and metal via structures (such as the first die-side redistribution wiring interconnects 381) tend to have low leakage current, and any high leakage current measured during testing of the passive devices within the integrated passive devices 405 may be presumed to be due to defects in the passive devices. In embodiments in which the integrated passive devices 405, the second die-side redistribution wiring interconnects 382, or the third die-side redistribution wiring interconnects 383 exhibit excessively high leakage current levels, such an interposer (300, 400, 500) may be discarded after testing, and only interposers (300, 400, 500) exhibiting acceptable levels of leakage currents may be subsequently used for further processing.

Figure 4A:
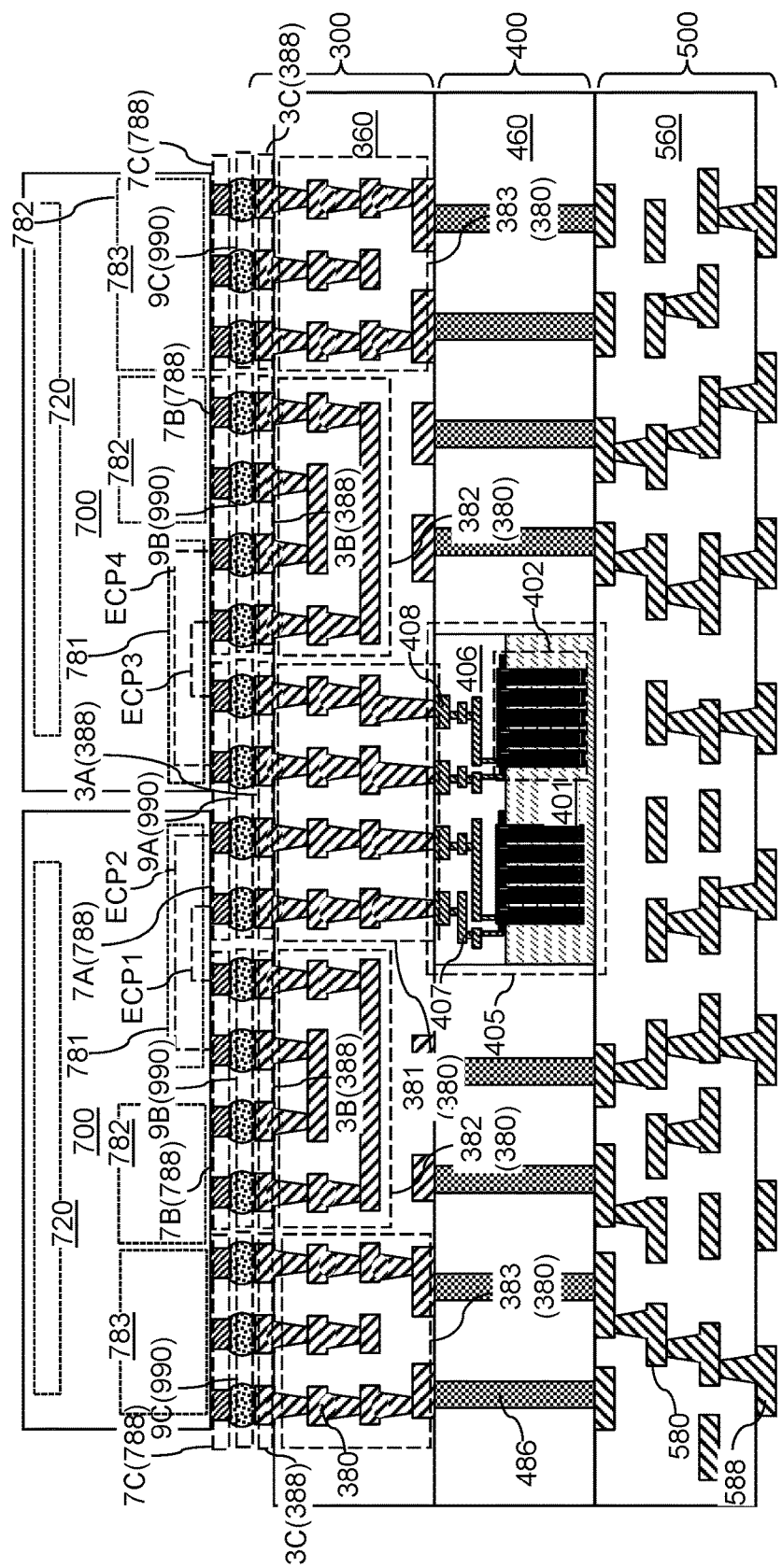
FIG. 4A is a vertical cross-sectional view of the intermediate structure after attaching semiconductor dies to an interposer according to an embodiment of the present disclosure.
Figure 4B:
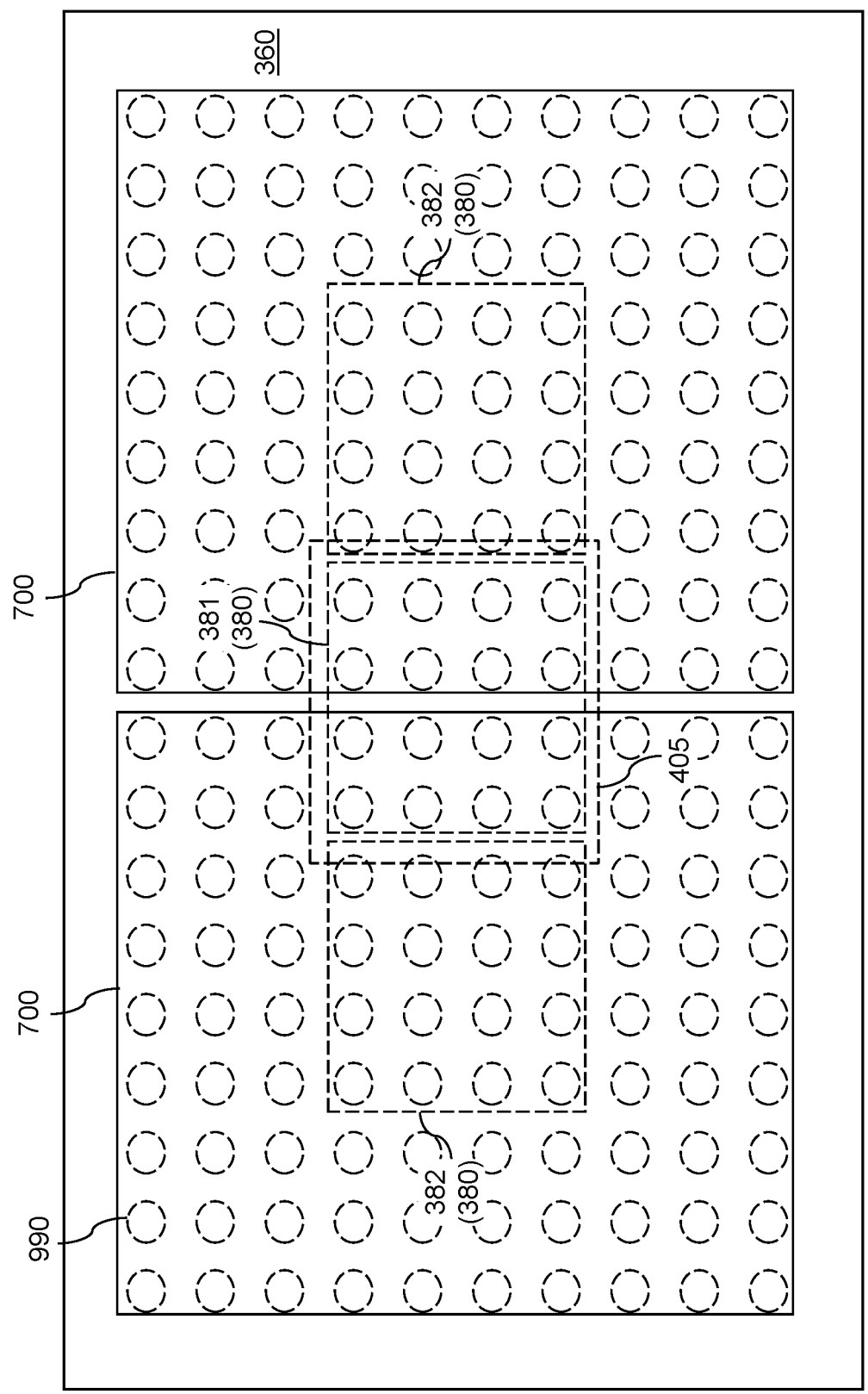
FIG. 4B is a partial see-through top-down view of the intermediate structure of FIG. 4A.

Referring to FIGS. 4A and 4B, a set of at least one semiconductor die 700 may be bonded to each interposer (300, 400, 500). In one embodiment, the interposers (300, 400, 500) may be arranged as a two-dimensional periodic array within the reconstituted wafer in the exemplary structure, and multiple sets of at least one semiconductor die 700 may be bonded to the interposers (300, 400, 500) as a two-dimensional periodic rectangular array of sets of at least one semiconductor die 700. The illustrated region in FIGS. 4A and 4B corresponds the area of a single unit area UA in which one set of at least one semiconductor die 700 (which includes two semiconductor dies 700 in the illustrated example) is bonded to an interposer (300, 400, 500).

Each set of at least one semiconductor die 700 may include any set of semiconductor dies known in the art. In one embodiment, each set of at least one semiconductor die 700 may include at least one system-on-chip (SoC) die and/or at least one memory die. Optionally, each set of at least one semiconductor die 700 may include at least one surface mount die known in the art. Each SoC die may comprise an application processor die, a central processing unit die, or a graphic processing unit die. In one embodiment, the at least one memory die may comprise a high bandwidth memory (HBM) die that includes a vertical stack of static random access memory dies. In one embodiment, the at least one semiconductor die 700 may include at least one system-on-chip (SoC) die and at least one high bandwidth memory (HBM) die. Each HBM die may comprise a vertical stack of static random access memory (SRAM) dies that are interconnected to one another through arrays of microbumps and are laterally surrounded by a respective molding material enclosure frame.

Each semiconductor die 700 may comprise a respective array of on-die bump structures 788. Each of the at least one semiconductor die 700 may be positioned in a face-down position such that on-die bump structures 788 face the on-interposer bump structures 388. Placement of the at least one semiconductor die 700 may be performed using a pick and place apparatus such that each of the on-die bump structures 788 may face a respective one of the on-interposer bump structures 388. Each set of at least one semiconductor die 700 may be placed within a respective unit area.

Generally, an array of solder material portions may be provided on each array of on-die bump structures 788, or on each array of on-interposer bump structures 388. Thus, each solder material portion 990 may be bonded to a respective on-die bump structure 788 and to a respective on-interposer bump structure 388.

Generally, an interposer (300, 400, 500) may be provided, which includes on-interposer bump structure 388 thereupon. At least one semiconductor die 700 may be provided, each of which includes a respective set of on-die bump structures 788. The at least one semiconductor die 700 may be bonded to the interposer (300, 400, 500) using the solder material portions 990 that are bonded to a respective on-interposer bump structure 388 and to a respective on-die bump structure 788. Each set of at least one semiconductor die 700 may be attached to a respective interposer (300, 400, 500) through a respective set of solder material portions 990.

In one embodiment, the on-die bump structures 788 and the on-interposer bump structures 388 may be configured for microbump bonding. In this embodiment, each of the on-die bump structures 788 and the on-interposer bump structures 388 may be configured as copper pillar structures having a diameter in a range from 10 microns to 50 microns, and may have a respective height in a range from 5 microns to 100 microns. The pitch of the microbumps in the direction of periodicity may be in a range from 20 microns to 100 microns, although lesser and greater pitches may also be used. Upon reflow, the lateral dimensions of each solder material portion 990 may be in a range from 100% to 150% of the lateral dimension (such as a diameter) of the adjoined on-die bump structure 788 or of the adjoined on-interposer bump structure 388.

According to an aspect of the present disclosure, the solder material portions 990 comprise first solder material portions 9A that are bonded to a respective one of the first on-interposer bump structures 3A, second solder material portions 9B that are bonded to a respective one of the second on-interposer bump structures 3B, and third solder material portions 9C that are bonded to a respective one of the third on-interposer bump structures 3C. Further, the on-die bump structures 788 comprise first on-die bump structures 7A that are bonded to a respective one of the first solder material portions 9A, second on-die bump structures 7B that are bonded to a respective one of the second solder material portions 9B, and third on-die bump structures 7C that are bonded to a respective one of the third solder material portions 9C.

Thus, each semiconductor die 700 may comprise respective first on-die bump structures 7A that are bonded to a respective one of the first on-interposer bump structures 3A through a respective first solder material portion 9A, second on-die bump structures 7B that are bonded to a respective one of the second on-interposer bump structures 3B through a respective second solder material portion 9B, and third on-die bump structures 7C that are bonded to a respective one of the third on-interposer bump structures 3C through a respective third solder material portion 9C.

According to an aspect of the present disclosure, each first semiconductor die 700 may comprise first metal interconnect structures 781 embedded within dielectric material layers and providing electrical connections between a respective one of the first on-interposer bump structures 3A and a respective one of the second on-interposer bump structures 3B through a respective one of the first solder material portions 9A and through a respective one of the second solder material portions 9B. Exemplary electrical connections provided by the first metal interconnect structures 781 are schematically represented as a first electrically conductive path ECP1, a second electrically conductive path ECP2, a third electrically conductive path ECP3, and a fourth electrically conductive path ECP4. While FIG. 8A illustrates only four electrically conductive paths, it is understood that as many electrically conductive paths as needed may be provided by the first metal interconnect structures 781 within at least one semiconductor die 700. The electrically conductive paths (ECP1, EPC2, ECP3, ECP4) may provide electrical connections between a pair of a first die-side redistribution wiring interconnect 381 and a second die-side redistribution wiring interconnect 382, and thus, between a pair of an electrical node within the integrated passive device 405 (such as a first electrode layer 41 or a second electrode layer 42) and a second die-side redistribution wiring interconnect 382.

In one embodiment, one, a plurality, and/or each of the at least one semiconductor die 700 comprises respective semiconductor devices 720 located on a respective semiconductor substrate, and respective second metal interconnect structures 782 embedded within respective dielectric material layers. The second metal interconnect structures 782 provide electrical connections to and from the semiconductor devices 720, and not in direct contact with any of the first metal interconnect structures 781.

In one embodiment, the first metal interconnect structures 781 are not in direct contact with any of the semiconductor devices 720. A subset of the second metal interconnect structures 782 is in direct contact with a respective one of the semiconductor devices 720, and is not in direct contact with any of the first metal interconnect structures 781. According to an aspect of the present disclosure, electrical nodes of the passive devices in the integrated passive device 405 and the first metal interconnect structures 781 are electrically connected to the semiconductor devices 720 through the second on-interposer bump structures 3B and through the second die-side redistribution wiring interconnects 382.

In one embodiment, the first metal interconnect structures 781 may be located entirely within the area of the integrated passive device 405 in a plan view, such as a see-through top-down view shown in FIG. 4B.

The third on-interposer bump structures 3C are electrically connected to the third die-side redistribution metal interconnects 383. The third on-interposer bump structures 3C may be bonded to third on-die bump structures 7C of a semiconductor die 700 through third solder material portions 9C. The semiconductor die 700 may comprise third metal interconnect structures 783 electrically connected to the semiconductor devices 720 within the semiconductor die 700. The third metal interconnect structures 783 may be electrically connected to the third on-die bump structures 7C. In this embodiment, the third on-interposer bump structures 3C may be electrically connected to semiconductor devices 720 within a semiconductor die 700 through third solder material portions 9C bonded to third on-die bump structures 7C of the semiconductor die 700.

Generally, the structure illustrated in FIGS. 4A and 4B of the present disclosure may include a semiconductor structure comprising: an interposer (300, 400, 500) comprising an integrated passive device 405, a die-side redistribution structure 300, first on-interposer bump structures 3A, and second on-interposer bump structures 3B, wherein the die-side redistribution structure 300 comprises first die-side redistribution wiring interconnects 381 electrically connecting electrical nodes within the integrated passive device 405 to the first on-interposer bump structures 3A, and further comprises second die-side redistribution wiring interconnects 382 each providing a respective electrical connection between a respective pair of second on-interposer bump structures 3B within the second on-interposer bump structures 3B; and a first semiconductor die 700 comprising first on-die bump structures 7A that are bonded to the first on-interposer bump structures 3A through first solder material portions 9A, and further comprising second on-die bump structures 7B that are bonded to the second on-interposer bump structures 3B through second solder material portions 9B. The first semiconductor die 700 comprises first metal interconnect structures 781 embedded within dielectric material layers and providing electrical connections between a respective one of the first on-interposer bump structures 3A and a respective one of the second on-interposer bump structures 3B through a respective one of the first solder material portions 9A and through a respective one of the second solder material portions 9B.

The substrate-side redistribution structure 500 is more distal from the first semiconductor die 700 than the integrated passive device 405 is from the first semiconductor die 700. In one embodiment, a plurality of semiconductor dies 700 may be attached to an interposer (300, 400, 500) through a respective array of solder material portions 990. In one embodiment, semiconductor devices 720 in each of the plurality of semiconductor dies 700 comprises respective electrical nodes that are electrically connected to respective nodes within the integrated passive device 405.

In one embodiment, one, a plurality, or each, of electrically conductive paths between a semiconductor device 720 in a semiconductor die 700 and an electrical node of the integrated passive device 405 may comprise a respective one of the first die-side redistribution wiring interconnects 381, a respective one of the first on-die bump structures 7A, a respective one of the first solder material portions 9A, a respective first on-die bump structure 7A, a respective first metal interconnect structure 781 that is electrically connected to the respective one of the first solder material portions 9A, a respective one of the second on-die bump structures 7B, a respective one of the second solder material portions 9B, a respective subset of the second die-side redistribution wiring interconnects 382, a respective additional one of the second solder material portions 9B, a respective additional of the second on-die bump structures 7B, and respective second metal interconnect structures 782 providing electrical connection between the respective additional one of the second solder material portions 9B and the semiconductor device 720.

In one embodiment, each electrically conductive path between the first metal interconnect structures 781 and the second metal interconnect structures 782 comprises the subset of the second die-side redistribution wiring interconnects 382; and each electrically conductive path between subset of the second die-side redistribution wiring interconnects 382 and the electrical node of the integrated passive device 405 comprises the subset of the first die-side redistribution wiring interconnects 381.

In one embodiment, the second die-side redistribution wiring interconnects 382 are configured such that any electrical current flow between the first metal interconnect structures 781 and the second metal interconnect structures 782 flows through the subset of the second die-side redistribution wiring interconnects 382; and the first die-side redistribution wiring interconnects 381 are configured such that any electrical current flow between the subset of the second die-side redistribution wiring interconnects 382 and the electrical node of the integrated passive device 405 flows through the subset of the first die-side redistribution wiring interconnects 381.

In one embodiment, an electrically conductive path including the subset of the second die-side redistribution wiring interconnects 382 comprises a first end that is electrically connected to the first metal interconnect structures 781 and comprises a second end that is electrically connected to the second metal interconnect structures 782; and an electrically conductive path including the subset of the first die-side redistribution wiring interconnects 381 comprises a first end that is electrically connected to the subset of the second die-side redistribution wiring interconnects 382 and comprises a second end that is electrically connected to the electrical node of the integrated passive device 405.

Figure 5:
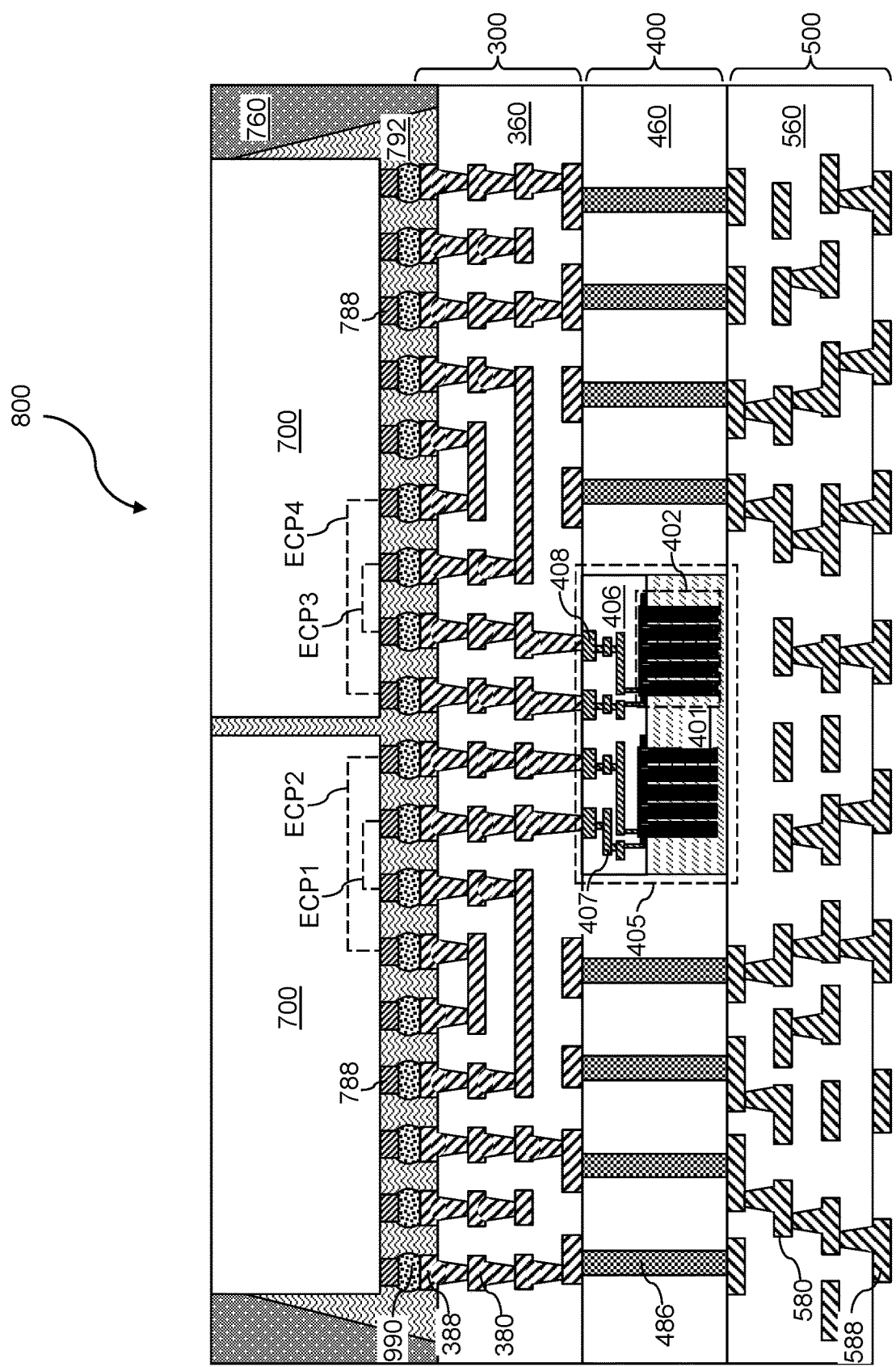
FIG. 5 is a vertical cross-sectional view of the intermediate structure after formation of molding compound die frames and dicing fan-out packages according to an embodiment of the present disclosure.
Figure 6:
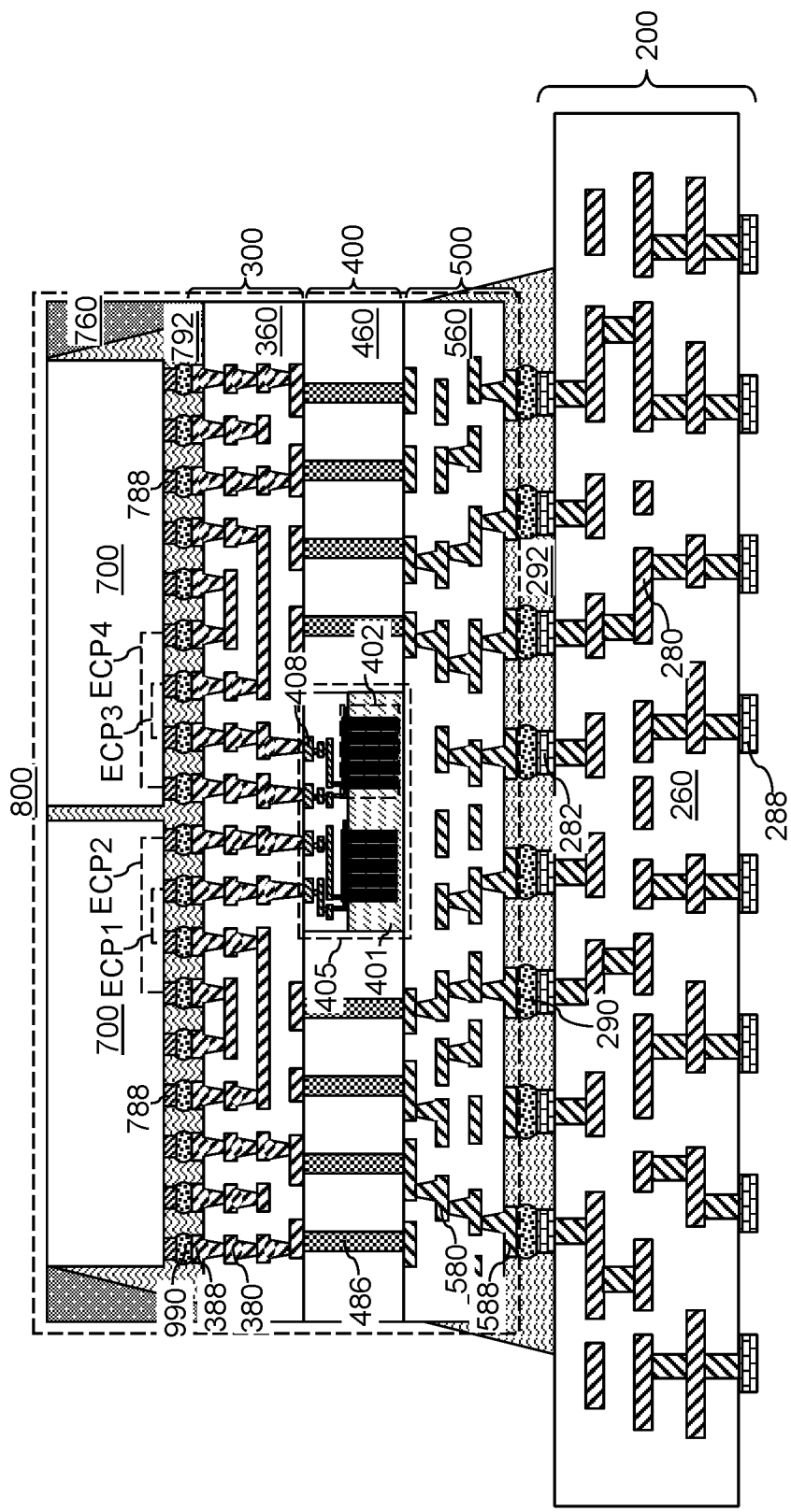
FIG. 6 is a vertical cross-sectional view of the intermediate structure after attaching a packaging substrate to a fan-out package according to an embodiment of the present disclosure.

Referring to FIG. 5, a die-side underfill material may be applied into each gap between the interposers (300, 400, 500) and sets of at least one semiconductor die 700 that are bonded to the interposers (300, 400, 500). The die-side underfill material may comprise any underfill material known in the art. A die-side underfill material portion 792 may be formed within each unit area between an interposer (300, 400, 500) and an overlying set of at least one semiconductor die 700. The die-side underfill material portions 792 may be formed by injecting the die-side underfill material around a respective array of solder material portions 990 in a respective unit area. Any known underfill material application method may be used, which may be, for example, the capillary underfill method, the molded underfill method, or the printed underfill method.

Within each unit area, a die-side underfill material portion 792 may laterally surround, and contact, a respective set of the solder material portions 990 within the unit area. The die-side underfill material portion 792 may be formed around, and contact, the solder material portions 990, the on-interposer bump structures 388, and the on-die bump structures 788 in the unit area. Generally, at least one semiconductor die 700 comprising a respective set of on-die bump structures 788 is attached to the on-interposer bump structures 388 through a respective set of solder material portions 990 within each unit area. Within each unit area, a die-side underfill material portion 792 laterally surrounds the on-interposer bump structures 388 and the on-die bump structures 788 of the at least one semiconductor die 700.

A molding compound (MC) may be applied to the gaps between assemblies of a respective set of at least one semiconductor die 700 and a respective die-side underfill material portion 792. The MC may include any material that may be used for the MC interposer frames 460 discussed above. The MC may include epoxy resin, hardener, silica (as a filler material), and other additives. The MC may be cured at a curing temperature to form an MC matrix, which is herein referred to as a die-level MC matrix or as a second MC matrix. The die-level MC matrix laterally surrounds and embeds each assembly of a set of at least one semiconductor die 700 and a die-side underfill material portion 792. The die-level MC matrix includes a plurality of molding compound (MC) die frames that may be laterally adjoined to one another. Each MC die frame 760 is a portion of the die-level MC matrix that is located within a respective unit area. Thus, each MC die frame 760 laterally surrounds, and embeds, a respective a set of at least one semiconductor die 700 and a respective die-side underfill material portion 792.

Portions of the die-level MC matrix that overlies the horizontal plane including the top surfaces of the at least one semiconductor die 700 may be removed by a planarization process. For example, the portions of the die-level MC matrix that overlies the horizontal plane may be removed using a chemical mechanical planarization (CMP). The reconstituted wafer comprises a combination of the die-level MC matrix, the at least one semiconductor die 700, the die-side underfill material portions 792, and the two-dimensional array of interposers (300, 400, 500). Each portion of the die-level MC matrix located within a unit area constitutes an MC die frame 760.

Each portion of the reconstituted wafer located within a unit area constitutes a fan-out package 800. Each fan-out package 800 may comprise at least one semiconductor die 700, an interposer (300, 400, 500), solder material portions 990, at least one die-side underfill material portion 792, and an MC die frame 760 that is a portion of the die-level MC matrix located within a respective unit area.

The reconstituted wafer includes a two-dimensional array of interposers (300, 400, 500), and further includes a two-dimensional array of sets of at least one semiconductor die 700 that are bonded to a respective interposer (300, 400, 500). The reconstituted wafer may be diced along dicing channels by performing a dicing process. The dicing channels correspond to the boundaries between neighboring pairs of unit areas. Each diced unit from the reconstituted wafer comprises a fan-out package 800. In other words, each diced portion of the assembly of the two-dimensional array of sets of at least one semiconductor die 700, the two-dimensional array of die-side underfill material portions 792, the die-level MC matrix, and the two-dimensional array of interposers (300, 400, 500) comprises a fan-out package 800. Each diced portion of the die-level MC matrix constitutes a molding compound die frame 760, i.e., an MC die frame 760. Generally, an assembly comprising at least one semiconductor die 700 and an interposer (such as an interposer (300, 400, 500)) may be provided. A fan-out package 800 constitutes such an assembly.

Figure 7:
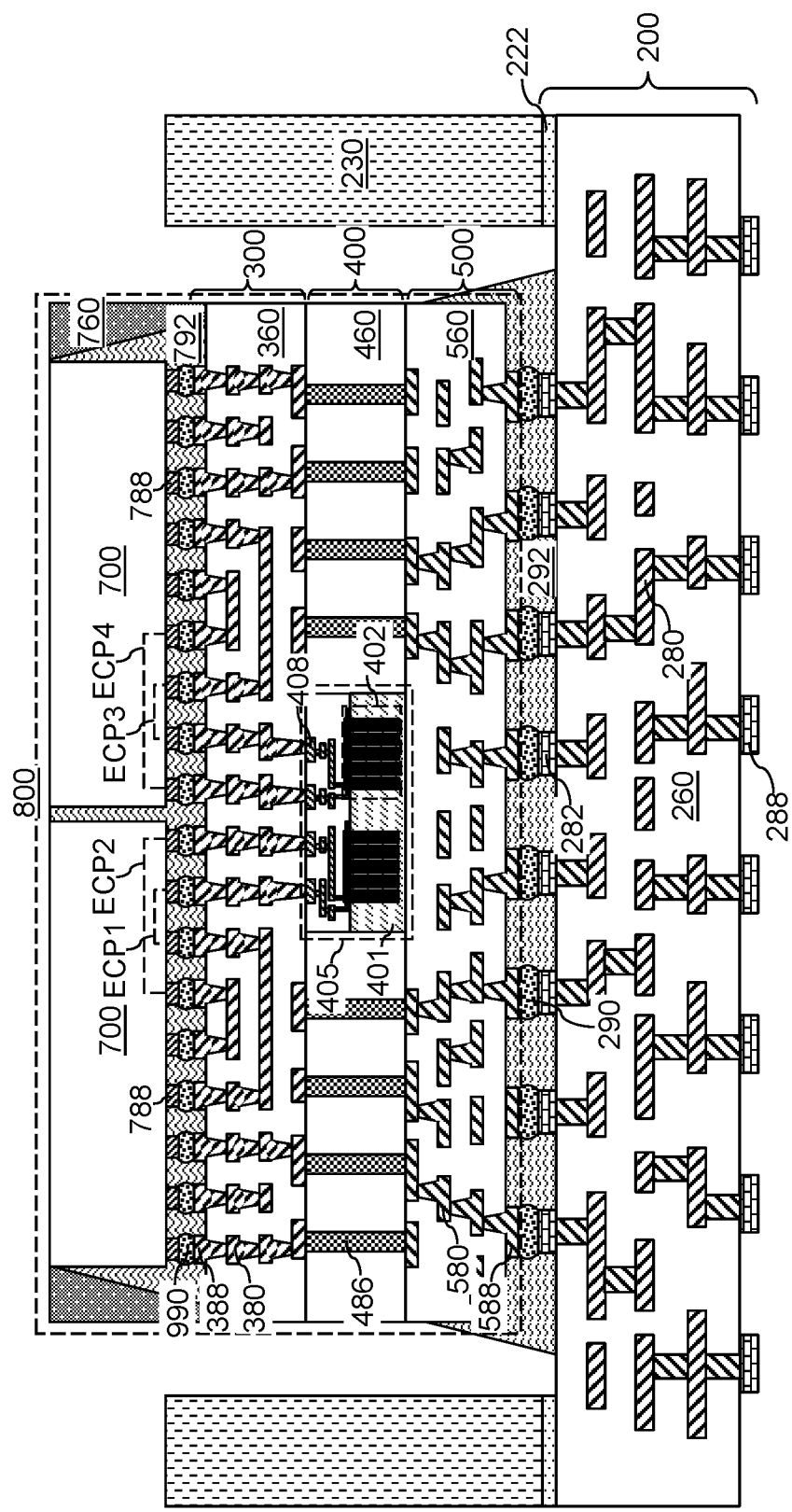
FIG. 7 is a vertical cross-sectional view of the structure after attaching a stiffener ring according to an embodiment of the present disclosure.

Referring to FIG. 7, a packaging substrate 200 may be provided. The packaging substrate 200 may be a cored packaging substrate including a core substrate, or a coreless packaging substrate that does not include a package core. Alternatively, the packaging substrate 200 may include a system-on-integrated packaging substrate (SoIS) including redistribution layers, dielectric interlayers, and/or at least one embedded interposer (such as a silicon interposer). Such a system-integrated packaging substrate may include layer-to-layer interconnections using solder material portions, microbumps, underfill material portions (such as molded underfill material portions), and/or an adhesion film. It is understood that the scope of the present disclosure is not limited by any particular type of substrate package. For example, an SoIS may be used in lieu of a cored packaging substrate. In embodiments in which SoIS is used, the core substrate may include a glass epoxy plate including an array of through-plate holes.

In one embodiment, the package substrate 200 may comprise substrate redistribution dielectric layers 260 embedding substrate redistribution wiring interconnects 280. In one embodiment, the packaging substrate 200 may include board-side surface laminar circuit (SLC) and a chip-side surface laminar circuit (SLC). An array of package-side bonding pads 282 may be provided on the side of the packaging substrate 200 that faces the fan-out package 800. An array of board-side bonding pads 288 may be formed on the side of the packaging substrate 200 that is subsequently connected to a printed circuit board. The array of board-side bonding pads 288 is configured to allow bonding through solder joints having a greater dimension than the C4 solder balls.

The assembly including the fan-out package 800 may be attached to the packaging substrate 200 using an array of solder material portions 290. Specifically, each of the solder material portions 290 may be bonded to a respective one of the interposer-side bonding pads 588 and to a respective one of package-side bonding pads 282. A reflow process may be performed to reflow the solder material portions 290 during the bonding process.

An underfill material may be applied into a gap between the interposer (300, 400, 500) and the packaging substrate 200. The underfill material may include any underfill material known in the art. An underfill material portion may be formed around the array of solder material portions 290 in the gap between the interposer (300, 400, 500) and the packaging substrate 200. This underfill material portion is formed between the interposer (300, 400, 500) and the packaging substrate 200, and thus, is herein referred to as an interposer-package underfill material portion 292, or as an IP underfill material portion 292.

A stiffener ring 230 may be optionally attached to the packaging substrate 200 using, for example, an adhesive layer 222.

Figure 8:
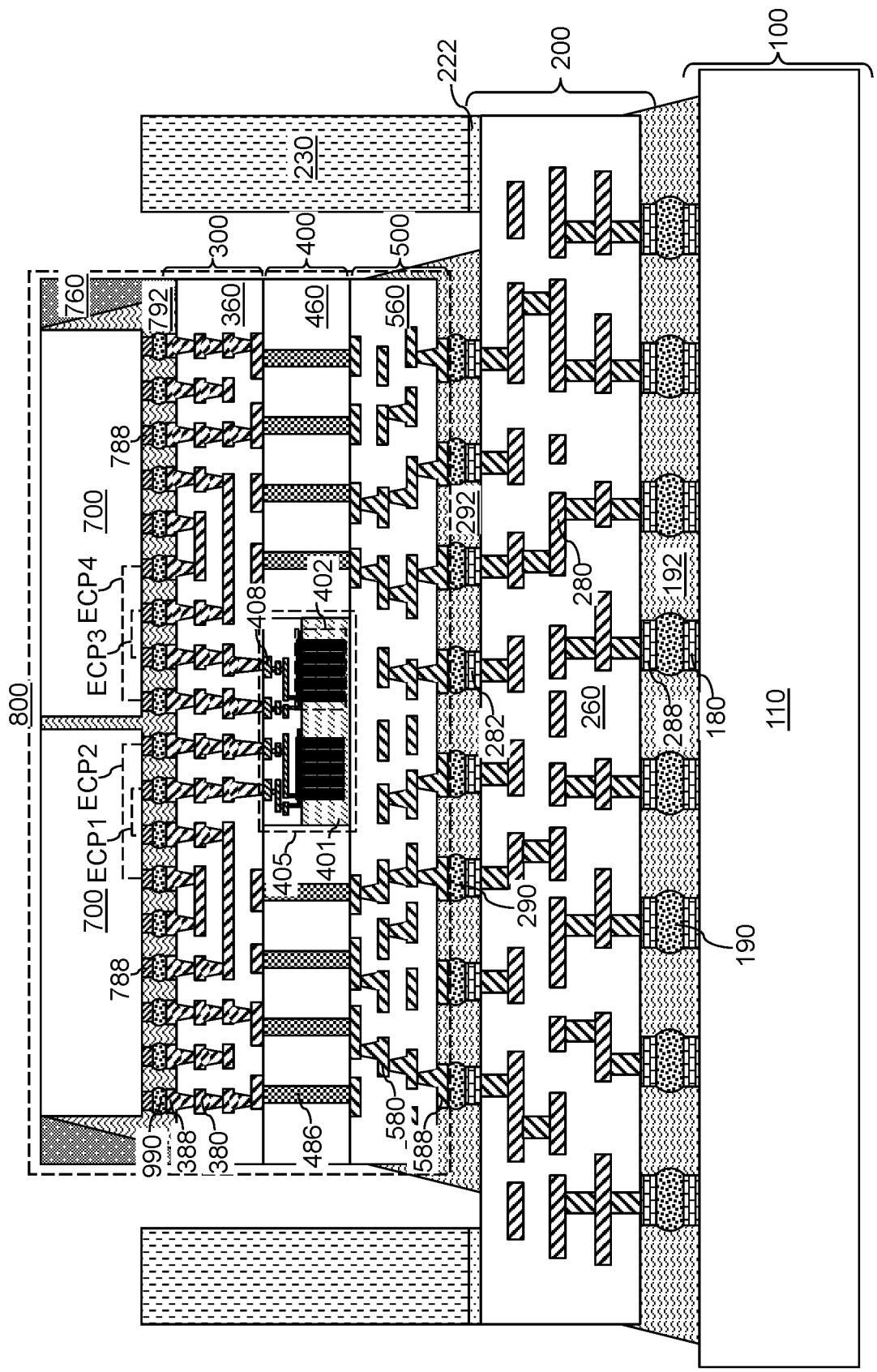
FIG. 8 is a vertical cross-sectional view of the structure after attaching the packaging substrate to a printed circuit board according to an embodiment of the present disclosure.

Referring to FIG. 8, a printed circuit board (PCB) 100 including a PCB substrate 110 and PCB bonding pads 180 may be provided. The PCB 100 includes a printed circuitry (not shown) at least on one side of the PCB substrate 110. An array of solder joints 190 may be formed to bond the array of board-side bonding pads 288 to the array of PCB bonding pads 180. The solder joints 190 may be formed by disposing an array of solder balls between the array of board-side bonding pads 288 and the array of PCB bonding pads 180, and by reflowing the array of solder balls. An additional underfill material portion, which is herein referred to as a board-substrate underfill material portion 192 or a BS underfill material portion 192, may be formed around the solder joints 190 by applying and shaping an underfill material. The packaging substrate 200 is attached to the PCB 100 through the array of solder joints 190.

Generally, a printed circuit board 100 may be bonded to the packaging substrate 200 through an array of solder joints 190. An additional underfill material portion (such as the board-substrate underfill material portion 192) may be formed between the printed circuit board 100 and the packaging substrate 200, and may laterally surround the solder joints 190.

Figure 9:
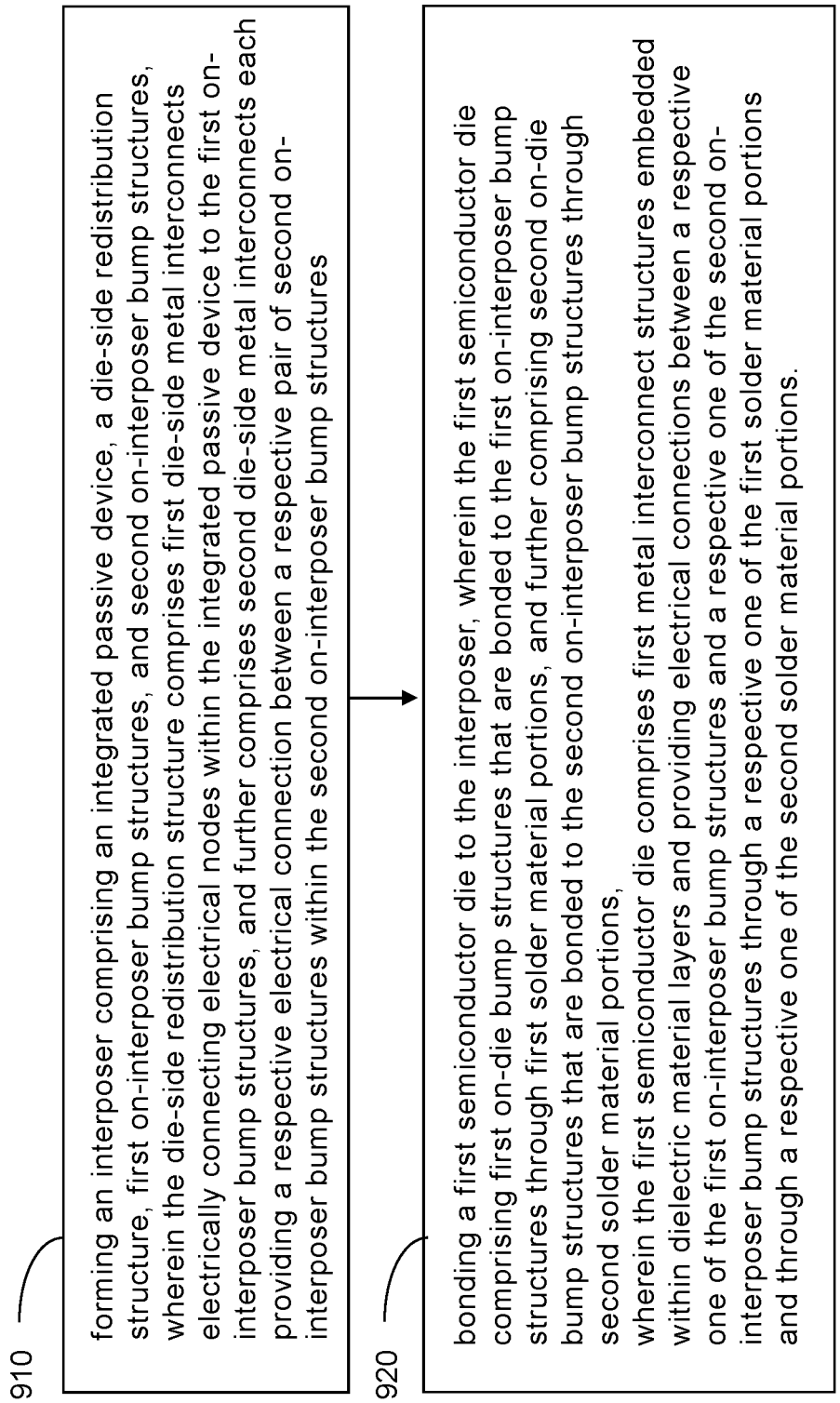
FIG. 9 is a first flowchart illustrating steps for forming a semiconductor structure according to an embodiment of the present disclosure.

Referring to FIG. 9, a first flowchart illustrates steps for forming a semiconductor structure according to an embodiment of the present disclosure.

Referring to step 910 and FIGS. 1-3, an interposer (300, 400, 500) may be formed, which may include an integrated passive device 405, a die-side redistribution structure 300, first on-interposer bump structures 3A, and second on-interposer bump structures 3B. The die-side redistribution structure 300 may include first die-side redistribution wiring interconnects 381 electrically connecting electrical nodes within the integrated passive device 405 to the first on-interposer bump structures 3A, and further may include second die-side redistribution wiring interconnects 382 each providing a respective electrical connection between a respective pair of second on-interposer bump structures 3B within the second on-interposer bump structures 3B.

Referring to step 920 and FIGS. 4A-8, a first semiconductor die 700 may be bonded to the interposer (300, 400, 500). The first semiconductor die 700 may include first on-die bump structures 7A that are bonded to the first on-interposer bump structures 3A through first solder material portions 9A, and further may include second on-die bump structures 7B that are bonded to the second on-interposer bump structures 3B through second solder material portions 9B. The first semiconductor die 700 includes first metal interconnect structures 781 embedded within dielectric material layers and providing electrical connections between a respective one of the first on-interposer bump structures 3A and a respective one of the second on-interposer bump structures 3B through a respective one of the first solder material portions 9A and through a respective one of the second solder material portions 9B.

In one embodiment, the first die-side redistribution wiring interconnects 381 may include vertical stacks of metal pads and metal via structures in which each of the metal pads is in direct contact with only with a respective overlying metal via structure, a respective underlying metal via structure, and the die-side redistribution dielectric layers. In one embodiment, the first metal interconnect structures 781 are located entirely within an area of the integrated passive device 405 in a plan view.

In one embodiment, the method may also include the step of testing electrical connections among the second die-side redistribution wiring interconnects 382 by applying first test bias voltages across pairs of second on-interposer bump structures 3B prior to bonding the first semiconductor die 700 to the interposer (300, 400, 500).

In one embodiment, the integrated passive device 405 may include a capacitor 402 including a first electrode layer 41, a node dielectric 43, and a second electrode layer 42; and the method may further include testing a leakage current between the first electrode layer 41 and the second electrode layer 42 by applying a second test bias voltage across the first electrode layer 41 and the second electrode layer 42 through a pair of first die-side redistribution wiring interconnects 381 within the first die-side redistribution wiring interconnects 381, wherein the second test bias voltage has a magnitude that is less than magnitudes of the first test bias voltages.

Figure 10:
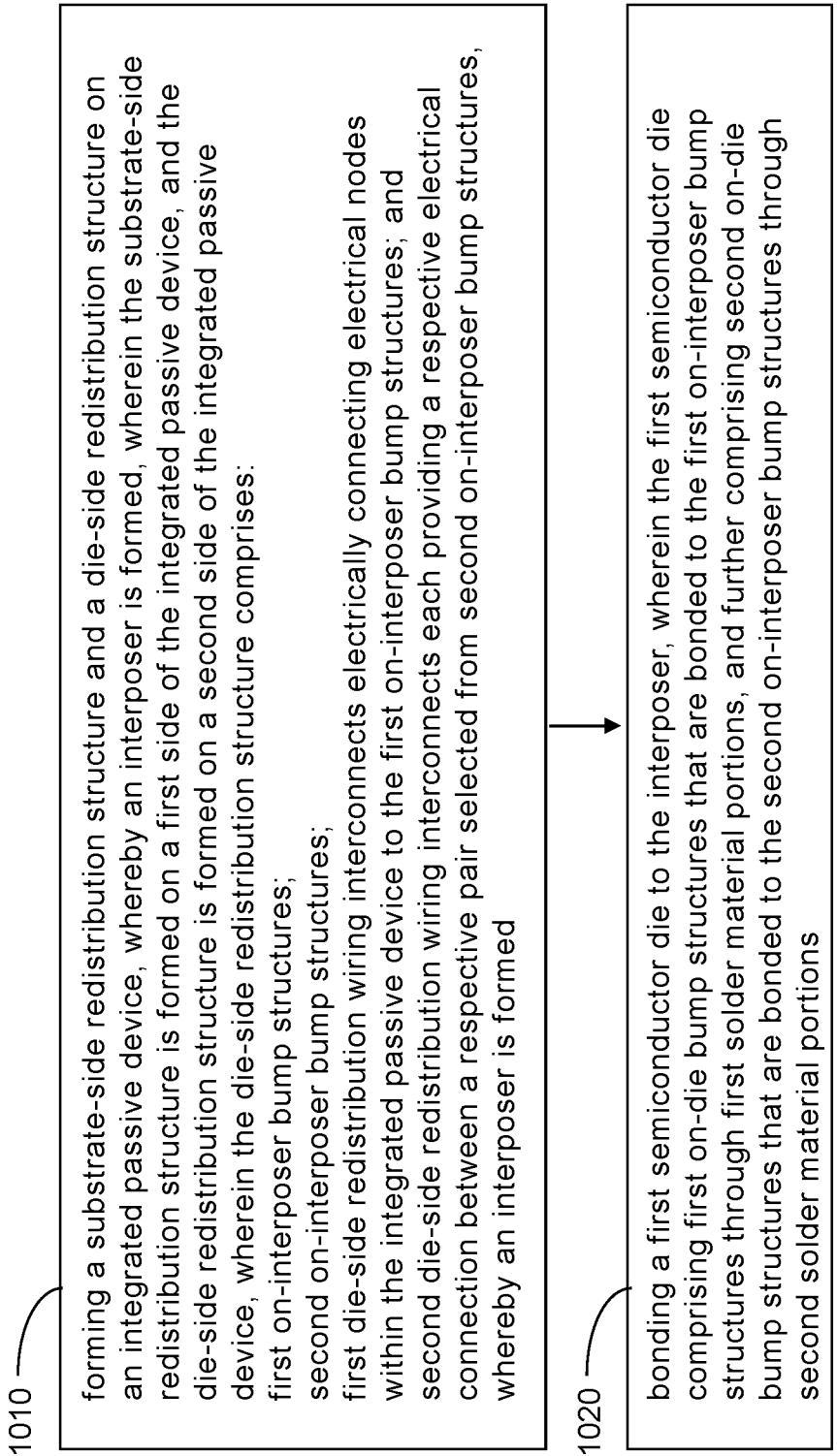
FIG. 10 is a second flowchart illustrating steps for forming a semiconductor structure according to an embodiment of the present disclosure.

Referring to FIG. 10, a second flowchart illustrates steps for forming a semiconductor structure according to an embodiment of the present disclosure.

Referring to step 1010 and FIGS. 1-3, a substrate-side redistribution structure 500 and a die-side redistribution structure 300 may be formed on an integrated passive device 405, whereby an interposer (300, 400, 500) is formed. The substrate-side redistribution structure 500 is formed on a first side of the integrated passive device 405, and the die-side redistribution structure 300 is formed on a second side of the integrated passive device 405. The die-side redistribution structure 300 may include first on-interposer bump structures 3A, second on-interposer bump structures 3B, first die-side redistribution wiring interconnects 381 electrically connecting electrical nodes within the integrated passive device 405 to the first on-interposer bump structures 3A, and second die-side redistribution wiring interconnects 382 each providing a respective electrical connection between a respective pair selected from second on-interposer bump structures 3B. An interposer (300, 400, 500) is thus formed.

Referring to step 1020 and FIGS. 4A-8, a first semiconductor die 700 is bonded to the interposer (300, 400, 500). The first semiconductor die 700 may include first on-die bump structures 7A that are bonded to the first on-interposer bump structures 3A through first solder material portions 9A, and further may include second on-die bump structures 7B that are bonded to the second on-interposer bump structures 3B through second solder material portions 9B.

In one embodiment, the first semiconductor die 700 may include first metal interconnect structures 781 embedded within dielectric material layers and providing electrical connections between a respective one of the first on-interposer bump 3A structures and a respective one of the second on-interposer bump structures 3B, a respective one of the first solder material portions 9A, and a respective one of the second solder material portions 9B. In one embodiment, the method may also include the step of testing electrical connections made using the second die-side redistribution wiring interconnects 382 by applying first test bias voltages across pairs of second on-interposer bump structures 3B selected from the second on-interposer bump structures 3B prior to bonding the first semiconductor die 700 to the interposer (300, 400, 500).

According to an aspect of the present disclosure and according to various embodiments of the present disclosure, a semiconductor structure is provided, which may include: an interposer (300, 400, 500) comprising an integrated passive device 405, a die-side redistribution structure 300, first on-interposer bump structures 3A, and second on-interposer bump structures 3B, wherein the die-side redistribution structure 300 may include first die-side redistribution wiring interconnects 381 electrically connecting electrical nodes within the integrated passive device 405 to the first on-interposer bump structures 3A, and further may include second die-side redistribution wiring interconnects 382 each providing a respective electrical connection between a respective pair of second on-interposer bump structures 3B within the second on-interposer bump structures 3B; and a first semiconductor die 700 comprising first on-die bump structures 7A that are bonded to the first on-interposer bump structures 3A through first solder material portions 9A, and further comprising second on-die bump structures 7B that are bonded to the second on-interposer bump structures 3B through second solder material portions 9B, wherein the first semiconductor die 700 may include first metal interconnect structures 781 embedded within dielectric material layers and providing electrical connections between a respective one of the first on-interposer bump structures 3A and a respective one of the second on-interposer bump structures 3B through a respective one of the first solder material portions 9A and through a respective one of the second solder material portions 9B.

In one embodiment, the second die-side redistribution wiring interconnects 382 do not directly contact any of the first die-side redistribution wiring interconnects 381. In one embodiment, the first die-side redistribution wiring interconnects 381 may include vertical stacks of metal pads and metal via structures in which each of the metal pads is in direct contact with only with a respective overlying metal via structure, a respective underlying metal via structure, and the die-side redistribution dielectric layers.

In one embodiment, the first metal interconnect structures 781 may be located entirely within an area of the integrated passive device 405 in a plan view. In one embodiment, the first semiconductor die 700 may include: semiconductor devices 720 located on a semiconductor substrate; and second metal interconnect structures 782 embedded within the dielectric material layers and providing electrical connections to and from the semiconductor devices 720 and not in direct contact with any of the first metal interconnect structures 781.

In one embodiment, the first metal interconnect structures 781 are not in direct contact with any of the semiconductor devices 720; and the first metal interconnect structures 781 are electrically connected to the semiconductor devices 720 through the second on-interposer bump structures 3B and through the second die-side redistribution wiring interconnects 382. In one embodiment, the interposer (300, 400, 500) may include: a set of through-integrated-fan-out-via (TIV) structures 486 laterally surrounding the integrated passive device 405; and a molding compound interposer frame 460 that laterally surrounds the integrated passive device 405 and the TIV structures 486.

In one embodiment, the interposer (300, 400, 500) may include: third die-side redistribution wiring interconnects 383 electrically connected to the TIV structures 486; and third on-interposer bump structures 3C electrically connected to third die-side redistribution metal interconnects 383 and electrically connected to semiconductor devices 720 within the first semiconductor die 700 through third solder material portions 9C bonded to third on-die bump structures 7C of the first semiconductor die 700.

In one embodiment, the integrated passive device 405 may include integrated-device metal interconnect structures 407 embedded within integrated-device dielectric material layers 406, wherein a subset of the first die-side redistribution wiring interconnects 381 is in direct contact with a subset of the integrated-device metal interconnect structures 407.

In one embodiment, the integrated passive device 405 may include a capacitor 402 including a first electrode layer 41, a node dielectric 43, and a second electrode layer 42; the first electrode layer 41 is electrically connected to one of the first die-side redistribution wiring interconnects 381 through a first subset of the integrated-device metal interconnect structures 407; and the second electrode layer 42 is electrically connected to another of the first die-side redistribution wiring interconnects 381 through a second subset of the integrated-device metal interconnect structures 407.

In one embodiment, the interposer (300, 400, 500) may include a substrate-side redistribution structure 500 comprising substrate-side redistribution wiring interconnects 580 embedded within substrate-side redistribution dielectric layers 560; and the substrate-side redistribution structure 500 is more distal from the first semiconductor die 700 than the integrated passive device 405 is from the first semiconductor die 700. In one embodiment, the integrated passive device 405 may include a semiconductor substrate 401 having a planar surface; and an entirety of an interface between the substrate-side redistribution dielectric layers 560 and the integrated passive device 405 coincides with the planar surface.

According to another aspect of the present disclosure and according to various embodiments of the present disclosure, a semiconductor structure is provided. The semiconductor structure may include: an interposer (300, 400, 500) comprising an integrated passive device 405, a die-side redistribution structure 300, first on-interposer bump structures 3A, and second on-interposer bump structures 3B, wherein the die-side redistribution structure 300 includes first die-side redistribution wiring interconnects 381 electrically connecting electrical nodes within the integrated passive device 405 to the first on-interposer bump structures 3A, and further includes second die-side redistribution wiring interconnects 382 each providing a respective electrical connection between a respective pair of second on-interposer bump structures 3B within the second on-interposer bump structures 3B; and a first semiconductor die 700 comprising first on-die bump structures 7A that are bonded to the first on-interposer bump structures 3A through first solder material portions 9A, and further comprising second on-die bump structures 7B that are bonded to the second on-interposer bump structures 3B through second solder material portions 9B, wherein an electrically conductive path between a semiconductor device 720 in the first semiconductor die 700 and an electrical node of the integrated passive device 405 may include one of the first die-side redistribution wiring interconnects 381, one of the first on-die bump structures 7A, one of the first solder material portions 9A, a first metal interconnect structure 781 that is electrically connected to the one of the first solder material portions 9A, one of the second solder material portions 9B, a subset of the second die-side redistribution wiring interconnects 382, an additional one of the second solder material portions 9B, and second metal interconnect structures 782 providing electrical connection between the additional one of the second solder material portions 9B and the semiconductor device 720.

In one embodiment, the interposer (300, 400, 500) may include die-side redistribution dielectric layers 360 embedding the first die-side redistribution wiring interconnects 381 and the second die-side redistribution wiring interconnects 382 and contacting a horizontal surface of the molding compound interposer frame 460 and contacting a horizontal surface of the integrated passive device 405. In one embodiment, the second die-side redistribution wiring interconnects 382 do not directly contact any of the first die-side redistribution wiring interconnects 381. In one embodiment, the first die-side redistribution wiring interconnects 381 may include vertical stacks of metal pads and metal via structures in which each of the metal pads is in direct contact with only with a respective overlying metal via structure, a respective underlying metal via structure, and the die-side redistribution dielectric layers.

According to another aspect of the present disclosure and according to various embodiments of the present disclosure, a semiconductor structure is provided. The semiconductor structure may include: an interposer (300, 400, 500) comprising an integrated passive device 405, a die-side redistribution structure 300, first on-interposer bump structures 3A, and second on-interposer bump structures 3B, wherein the die-side redistribution structure 300 may include first die-side redistribution wiring interconnects 381 electrically connecting electrical nodes within the integrated passive device 405 to the first on-interposer bump structures 3A, and further may include second die-side redistribution wiring interconnects 382 each providing a respective electrical connection between a respective pair of second on-interposer bump structures 3B within the second on-interposer bump structures 3B and not directly contacting any of the first die-side redistribution wiring interconnects 381; and a first semiconductor die 700 comprising first on-die bump structures 7A that are bonded to the first on-interposer bump structures 3A through first solder material portions 9A, and further comprising second on-die bump structures 7B that are bonded to the second on-interposer bump structures 3B through second solder material portions 9B, wherein a semiconductor device 720 within the first semiconductor die 700 is electrically connected to an electrical node of the integrated passive device 405 through a subset of the first die-side redistribution wiring interconnects 381, first metal interconnect structures 781 located within the first semiconductor die 700, a subset of the second die-side redistribution wiring interconnects 382, and second metal interconnect structures 782 located within the second semiconductor die 700 and not in direct contact with any of the first metal interconnect structures 781.

In one embodiment, each electrically conductive path between the first metal interconnect structures 781 and the second metal interconnect structures 782 may include the subset of the second die-side redistribution wiring interconnects 382; and each electrically conductive path between subset of the second die-side redistribution wiring interconnects 382 and the electrical node of the integrated passive device 405 may include the subset of the first die-side redistribution wiring interconnects 381. In one embodiment, the second die-side redistribution wiring interconnects 382 are configured such that any electrical current flow between the first metal interconnect structures 781 and the second metal interconnect structures 782 flows through the subset of the second die-side redistribution wiring interconnects 382; and the first die-side redistribution wiring interconnects 381 are configured such that any electrical current flow between the subset of the second die-side redistribution wiring interconnects 382 and the electrical node of the integrated passive device 405 flows through the subset of the first die-side redistribution wiring interconnects 381.

In one embodiment, an electrically conductive path including the subset of the second die-side redistribution wiring interconnects 382 may include a first end that is electrically connected to the first metal interconnect structures 781 and may include a second end that is electrically connected to the second metal interconnect structures 782; and an electrically conductive path including the subset of the first die-side redistribution wiring interconnects 381 may include a first end that is electrically connected to the subset of the second die-side redistribution wiring interconnects 382 and may include a second end that is electrically connected to the electrical node of the integrated passive device 405.

The various embodiments of the present disclosure may be used to provide testing of passive components having a low breakdown voltage at a low test voltage, and to test the leakage current level of a predominant portion of redistribution wiring interconnects at a high test voltage. The predominant portion of the redistribution wiring interconnects may be used to distribute electrical connections between the passive components and various nodes of semiconductor devices in a semiconductor die. Only a small fraction of the redistribution wiring structures may be directly connected to the passive components in a manner that minimizes leakage currents, such as in the form of vertical stacks of metal pads and metal vias that have limited lateral extents. Internal electrical connections within a semiconductor die may be used to complete the electrical connection between the passive devices and the semiconductor devices within the semiconductor die.

According to another aspect of the present disclosure, a method of forming a semiconductor structure is provided. The method may include the steps of: forming an interposer (300, 400, 500) comprising an integrated passive device 405, a die-side redistribution structure 300, first on-interposer bump structures 3A, and second on-interposer bump structures 3B, wherein the die-side redistribution structure 300 may include first die-side redistribution wiring interconnects 381 electrically connecting electrical nodes within the integrated passive device 405 to the first on-interposer bump structures 3A, and further may include second die-side redistribution wiring interconnects 382 each providing a respective electrical connection between a respective pair of second on-interposer bump structures 3B within the second on-interposer bump structures 3B and electrically isolated from each of the first die-side redistribution wiring interconnects; and bonding a first semiconductor die 700 to the interposer (300, 400, 500), wherein the first semiconductor die 700 may include first on-die bump structures 7A that are bonded to the first on-interposer bump structures 3A through first solder material portions 9A, and further comprising second on-die bump structures 7B that are bonded to the second on-interposer bump structures 3B through second solder material portions 9B, wherein the first semiconductor die 700 may include first metal interconnect structures 781 providing electrically conductive paths between a respective one of the first solder material portions 9a and a respective one of the second solder material portions 9B.

In one embodiment, each of the electrically conductive paths electrically connects a respective one of the first on-interposer bump structures 3A and a respective one of the second on-interposer bump structures 3B. In one embodiment, the first die-side redistribution wiring interconnects 381 may include vertical stacks of metal pads and metal via structures in which each of the metal pads is in direct contact with only with a respective overlying metal via structure, a respective underlying metal via structure, and the die-side redistribution dielectric layers. In one embodiment, the first metal interconnect structures 781 are formed entirely within an area of the integrated passive device in a plan view 405.

In one embodiment, the first semiconductor die 700 may include: semiconductor devices 720 located on a semiconductor substrate; and second metal interconnect structures 782 embedded within the dielectric material layers 760 and providing electrical connections among the semiconductor devices 720 and not in direct contact with any of the first metal interconnect structures 781. In one embodiment, the first metal interconnect structures 781 are not in direct contact with any of the semiconductor devices 720; and the first metal interconnect structures 781 are electrically connected to the semiconductor devices 720 through the second on-interposer bump structures 3B and through the second die-side redistribution wiring interconnects 382. In one embodiment, the interposer may include: a set of through-integrated-fan-out-via (TIV) structures 486 laterally surrounding the integrated passive device 405; and a molding compound interposer frame 460 that laterally surrounds the integrated passive device 405 and the TIV structures 486. In one embodiment, the interposer (300, 400, 500) may include: third die-side redistribution wiring interconnects 383 electrically connected to the TIV structures 486; and third on-interposer bump structures 3C electrically connected to third die-side redistribution wiring interconnects 383 and electrically connected to semiconductor devices 720 within the first semiconductor die 700 through third solder material portions 9C bonded to third on-die bump structures 7C of the first semiconductor die 700. In one embodiment, the integrated passive device 405 may include integrated-device metal interconnect structures 407 embedded within integrated-device dielectric material layers 406, wherein a subset of the first die-side redistribution wiring interconnects 381 is in direct contact with a subset of the integrated-device metal interconnect structures 407. In one embodiment, the integrated passive device 405 may include a capacitor 402 including a first electrode layer 41, a node dielectric 43, and a second electrode layer 42; the first electrode layer 41 is electrically connected to one of the first die-side redistribution wiring interconnects 381 through a first subset of the integrated-device metal interconnect structures 407; and the second electrode layer 42 is electrically connected to another of the first die-side redistribution wiring interconnects 381 through a second subset of the integrated-device metal interconnect structures 407. In one embodiment, the interposer (300, 400, 500) may include a substrate-side redistribution structure 500 that is formed over the integrated passive device 405, wherein the substrate-side redistribution structure 500 may include substrate-side redistribution wiring interconnects 580 embedded within substrate-side redistribution dielectric layers 560; and the die-side redistribution structure 300 is formed on an opposite side of the substrate-side redistribution structure 500 relative to the integrated passive device 405. In one embodiment, the integrated passive device 405 may include a semiconductor substrate having a planar surface; and the substrate-side redistribution dielectric layers 560 are formed on the planar surface of the integrated passive device 405.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
an interposer comprising:
an integrated passive device;
a die-side redistribution structure;
first on-interposer bump structures; and
second on-interposer bump structures,
wherein the die-side redistribution structure comprises first die-side redistribution wiring interconnects electrically connecting electrical nodes within the integrated passive device to the first on-interposer bump structures, and further comprises second die-side redistribution wiring interconnects each providing a respective electrical connection between a respective pair of second on-interposer bump structures within the second on-interposer bump structures; and
a first semiconductor die comprising:
first on-die bump structures that are bonded to the first on-interposer bump structures through first solder material portions; and
second on-die bump structures that are bonded to the second on-interposer bump structures through second solder material portions,
wherein the first semiconductor die comprises first metal interconnect structures embedded within dielectric material layers and providing electrical connections between a respective one of the first on-interposer bump structures and a respective one of the second on-interposer bump structures through a respective one of the first solder material portions and through a respective one of the second solder material portions.

2. The semiconductor structure of claim 1, wherein the second die-side redistribution wiring interconnects do not directly contact any of the first die-side redistribution wiring interconnects.

3. The semiconductor structure of claim 1, wherein the first die-side redistribution wiring interconnects comprises vertical stacks of metal pads and metal via structures in which each of the metal pads is in contact with a respective overlying metal via structure, a respective underlying metal via structure, and die-side redistribution dielectric layers.

4. The semiconductor structure of claim 1, wherein the first metal interconnect structures are located entirely within an area of the integrated passive device in a plan view.

5. The semiconductor structure of claim 1, wherein the first semiconductor die comprises:
semiconductor devices located on a semiconductor substrate; and
second metal interconnect structures embedded within the dielectric material layers and providing electrical connections to and from the semiconductor devices and not in direct contact with any of the first metal interconnect structures.

6. The semiconductor structure of claim 5, wherein:
the first metal interconnect structures are not in direct contact with any of the semiconductor devices; and
the first metal interconnect structures are electrically connected to the semiconductor devices through the second on-interposer bump structures and through the second die-side redistribution wiring interconnects.

7. The semiconductor structure of claim 1, wherein the interposer comprises:
a set of through-integrated-fan-out-via (TIV) structures laterally surrounding the integrated passive device; and a molding compound interposer frame that laterally surrounds the integrated passive device and the TIV structures.

8. The semiconductor structure of claim 7, wherein the interposer comprises:
third die-side redistribution wiring interconnects electrically connected to the TIV structures; and
third on-interposer bump structures electrically connected to third die-side redistribution wiring interconnects and electrically connected to semiconductor devices within the first semiconductor die through third solder material portions bonded to third on-die bump structures of the first semiconductor die.

9. The semiconductor structure of claim 1, wherein the integrated passive device comprises integrated-device metal interconnect structures embedded within integrated-device dielectric material layers, wherein a subset of the first die-side redistribution wiring interconnects is in direct contact with a subset of the integrated-device metal interconnect structures.

10. The semiconductor structure of claim 9, wherein:
the integrated passive device comprises a capacitor including a first electrode layer, a node dielectric, and a second electrode layer;
the first electrode layer is electrically connected to one of the first die-side redistribution wiring interconnects through a first subset of the integrated-device metal interconnect structures; and
the second electrode layer is electrically connected to another of the first die-side redistribution wiring interconnects through a second subset of the integrated-device metal interconnect structures.

11. The semiconductor structure of claim 1, wherein:
the interposer comprises a substrate-side redistribution structure comprising substrate-side redistribution wiring interconnects embedded within substrate-side redistribution dielectric layers; and
the substrate-side redistribution structure is more distal from the first semiconductor die than the integrated passive device is from the first semiconductor die.

12. The semiconductor structure of claim 11, wherein:
the integrated passive device comprises a semiconductor substrate having a planar surface; and
an entirety of an interface between the substrate-side redistribution dielectric layers and the integrated passive device coincides with the planar surface.

13. A method of forming a semiconductor structure comprising:
forming an interposer, wherein the interposer comprises an integrated passive device;
a die-side redistribution structure;
first on-interposer bump structures; and
second on-interposer bump structures,
wherein the die-side redistribution structure comprises first die-side redistribution wiring interconnects electrically connecting electrical nodes within the integrated passive device to the first on-interposer bump structures, and further comprises second die-side redistribution wiring interconnects each providing a respective electrical connection between a respective pair of second on-interposer bump structures within the second on-interposer bump structures; and
bonding a first semiconductor die to the interposer, wherein the first semiconductor die comprises:
first on-die bump structures that are bonded to the first on-interposer bump structures through first solder material portions; and
second on-die bump structures that are bonded to the second on-interposer bump structures through second solder material portions,
wherein the first semiconductor die comprises first metal interconnect structures embedded within dielectric material layers and providing electrical connections between a respective one of the first on-interposer bump structures and a respective one of the second on-interposer bump structures through a respective one of the first solder material portions and through a respective one of the second solder material portions.

14. The method of claim 13, wherein the first die-side redistribution wiring interconnects comprise vertical stacks of metal pads and metal via structures in which each of the metal pads is in direct contact with a respective overlying metal via structure, a respective underlying metal via structure, and die-side redistribution dielectric layers.

15. The method of claim 13, wherein the first metal interconnect structures are located within an area of the integrated passive device in a plan view.

16. The method of claim 13, further comprising testing electrical connections made using the second die-side redistribution wiring interconnects by applying first test bias voltages across pairs of second on-interposer bump structures prior to bonding the first semiconductor die to the interposer.

17. The method of claim 16, wherein:
the integrated passive device comprises a capacitor including a first electrode layer, a node dielectric, and a second electrode layer; and
the method further comprises testing a leakage current between the first electrode layer and the second electrode layer by applying a second test bias voltage across the first electrode layer and the second electrode layer through a pair of first die-side redistribution wiring interconnects within the first die-side redistribution wiring interconnects, wherein the second test bias voltage has a magnitude that is less than magnitudes of the first test bias voltages.

18. A method of forming a semiconductor structure comprising:
forming a substrate-side redistribution structure and a die-side redistribution structure on an integrated passive device, whereby an interposer is formed, wherein the substrate-side redistribution structure is formed on a first side of the integrated passive device, and the die-side redistribution structure is formed on a second side of the integrated passive device, wherein the die-side redistribution structure comprises:
first on-interposer bump structures;
second on-interposer bump structures;
first die-side redistribution wiring interconnects electrically connecting electrical nodes within the integrated passive device to the first on-interposer bump structures; and
second die-side redistribution wiring interconnects each providing a respective electrical connection between a respective pair selected from second on-interposer bump structures, whereby an interposer is formed; and
bonding a first semiconductor die to the interposer, wherein the first semiconductor die comprises:
first on-die bump structures that are bonded to the first on-interposer bump structures through first solder material portions; and second on-die bump structures that are bonded to the second on-interposer bump structures through second solder material portions.

19. The method of claim 18, wherein the first semiconductor die comprises first metal interconnect structures embedded within dielectric material layers and providing electrical connections between a respective one of the first on-interposer bump structures and a respective one of the second on-interposer bump structures, a respective one of the first solder material portions, and a respective one of the second solder material portions.

20. The method of claim 18, further comprising testing electrical connections made using the second die-side redistribution wiring interconnects by applying first test bias voltages across pairs of second on-interposer bump structures selected from the second on-interposer bump structures prior to bonding the first semiconductor die to the interposer.

* * * * *